US006768183B2

(12) United States Patent
Takahashi et al.

(10) Patent No.: US 6,768,183 B2
(45) Date of Patent: Jul. 27, 2004

(54) SEMICONDUCTOR DEVICE HAVING BIPOLAR TRANSISTORS

(75) Inventors: Shigeki Takahashi, Okazaki (JP); Satoshi Shiraki, Toyohashi (JP); Hiroaki Himi, Nagoya (JP); Hiroyuki Ban, Hazu-gun (JP); Osamu Seya, Nagoya (JP)

(73) Assignee: Denso Corporation, Kariya (JP)

( * ) Notice: Subject to any disclaimer, the term of this patent is extended or adjusted under 35 U.S.C. 154(b) by 12 days.

(21) Appl. No.: 10/125,582

(22) Filed: Apr. 19, 2002

(65) Prior Publication Data

US 2002/0153592 A1 Oct. 24, 2002

(30) Foreign Application Priority Data

Apr. 20, 2001 (JP) ....................................... 2001-123003
Jul. 4, 2001 (JP) ....................................... 2001-203663

(51) Int. Cl.[7] ................................................ H01L 29/00
(52) U.S. Cl. ....................... 257/511; 257/517; 257/525; 257/526; 257/557; 257/560; 257/561; 257/565
(58) Field of Search ................................ 257/374, 511, 257/517, 525, 526, 557, 559, 560, 561, 565

(56) References Cited

U.S. PATENT DOCUMENTS 3,895,392 A * 7/1975 Polata et al. ................ 257/565
4,299,024 A * 11/1981 Piotrowski .................. 438/203
4,665,425 A * 5/1987 Piotrowski .................. 257/525
4,743,950 A * 5/1988 Roggwiller ................. 257/164
4,868,626 A * 9/1989 Nakazato et al. ........... 257/378
5,041,895 A 8/1991 Contiero et al.
5,045,912 A * 9/1991 Ohki .......................... 257/370
5,068,702 A * 11/1991 Giannella ................... 257/560
5,072,287 A * 12/1991 Nakagawa et al. ......... 257/500
5,179,036 A * 1/1993 Matsumoto ................. 438/203
5,416,039 A 5/1995 Yilmaz et al.
5,554,880 A * 9/1996 Metzler et al. ............. 257/560
5,572,063 A * 11/1996 Iranmanesh ................. 257/565
5,592,015 A 1/1997 Iida et al.
5,786,622 A * 7/1998 Ronkainen .................. 257/578
5,856,695 A 1/1999 Ito et al.
6,114,746 A 9/2000 Leonardi et al.
RE37,424 E 10/2001 Contiero et al.
6,559,505 B1 * 5/2003 Fallica ....................... 257/350
6,611,043 B2 * 8/2003 Takiguchi ................... 257/565

FOREIGN PATENT DOCUMENTS

| | | | | |
|---|---|---|---|---|
| GB | 2 167 231 | * | 5/1986 | ........... H01L/27/04 |
| JP | 61-85863 | * | 5/1986 | ................. 257/511 |
| JP | 2-22856 | * | 1/1990 | ................. 257/555 |
| JP | 6-97275 | * | 4/1994 | ................. 257/511 |
| JP | 6-163839 | * | 6/1994 | ................. 257/556 |

OTHER PUBLICATIONS

Tamaki et al., Evaluation of High–Performance SOI Compltementary BiCMOS devices by using Test Structures, March 2001, IEEE, Int. Conference on Microelectronic Test Sturctures, vol. 14, pp. 245–249.*

Bruno Murari, "Mixed Bipolar–CMOS–DMOS Smart Power IC Technology," *21st Conference On Microelectronics*, Sep. 29—Oct. 1, 1993, pp. 1–9.

* cited by examiner

*Primary Examiner*—George Eckert
(74) *Attorney, Agent, or Firm*—Posz & Bethards, PLC

(57) ABSTRACT

An NPN bipolar transistor and a PNP bipolar transistor are formed in a semiconductor substrate. The NPN bipolar transistor has a p type emitter region, a p type collector region and an n type base region and is formed in an NPN forming region. The PNP bipolar transistor has an n type emitter region, an n type collector region and a p type base region and is formed in a PNP forming region. Only one conductive type burying region is formed in at least one of the NPN forming region and the PNP forming region. A current that flows from the p type emitter region to the n type base region flows in the n type base region in a direction perpendicular to the substrate.

55 Claims, 21 Drawing Sheets

SEMICONDUCTOR DEVICE HAVING BIPOLAR TRANSISTORS

CROSS REFERENCE TO RELATED APPLICATIONS

This application is based upon and claims the benefit of Japanese Patent Application No. 2001-123003 filed on Apr. 20, 2001 and No. 2001-203663 filed on Jul. 4, 2001, the contents of which are incorporated herein by reference.

FIELD OF THE INVENTION

The present invention relates to a semiconductor device having bipolar transistors.

BACKGROUND OF THE INVENTION

U.S. Pat. No. 5,856,695 discloses a semiconductor device having NPN transistors and PNP transistors. In the semiconductor device, vertical-type transistors having an n+ burying region and p+ burying region are used as the NPN transistors and the PNP transistors in order to coincide both electrical features thereof.

However, both the n+ burying region and the p+ burying region are needed, and masks for forming the n+ burying region and the p+ burying region have to be prepared. Therefore, the manufacturing cost of the semiconductor device is increased.

Alternatively, a lateral-type transistor can be employed as the PNP transistor to avoid above-mentioned limitation. However, use of a lateral-type transistor has other associated limitations.

First, as shown in FIGS. 23A, 23B, a number of carriers are stored in an n+ base region J1 of the PNP transistor because an n+ base region J1 of the PNP transistor is wider than the p+ base region J2. Therefore, a switching speed of the PNP transistor is larger than that of the NPN transistor, thereby generating an unbalance in the switching speeds.

Second, as shown in FIG. 24, a current amplification ratio of the PNP transistor is not fixed in comparison with that of the NPN transistor. Therefore, it is difficult to use the lateral-type transistor in a complementary device.

An SOI (silicon On Insulator) substrate is often used for making a semiconductor device. The SOI substrate has a support layer, an element forming layer and a burying oxide layer that is disposed between the support layer and the element forming layer. In the semiconductor device using the SOI substrate, trenches that reach the oxide layer are provided to isolate respective semiconductor elements.

In a semiconductor device manufactured using an SOI substrate, it is possible to increase a withstanding feature with respect to noise, and to prevent parasitic diodes or transistors in the semiconductor device from activating.

As shown in FIGS. 25A, 25B, a trench 102 is formed in an element forming layer 101 for isolating respective semiconductor elements. A high impurity conductive burying diffusion region 104 is formed on a side of a burying oxide layer 103 of the element forming layer 101. A support layer 105 is disposed on the side of the burying oxide layer 103 that is opposite to the side of the element forming layer 101.

A base region 107 and a V-shaped emitter region 108 are formed in a surface region of the element forming layer 101. A collector region 109 is formed in the surface of the element forming layer 101 separately from the base region 107 and the emitter region 108.

A current flows between an emitter electrode and a collector electrode (not shown) through the burying diffusion region 104. Therefore, resistance between the emitter electrode and the collector electrode decreases, thereby ensuring required current amount.

When the burying diffusion region 104 is formed in the SOI substrate, an ion implantation is conducted from a surface of the element forming layer 101. Also, the burying oxide layer 103 is formed on a surface of the support layer 105. Thereafter, the element forming layer 101 and the support layer 105 are stacked.

Therefore, the element forming layer 101 needs a thickness corresponding to that of the burying diffusion region 104. Accordingly, the formation time of the trench 102 is typically long because the depth of the trench 102 increases depending on the thickness of the element forming layer 101.

Further, because the joint adherence between the burying oxide layer 103 and the burying diffusion region 104 is not very good, the yield ratio of the SOI substrate is low.

On the other hand, the yield ratio of the SOI substrate can be increased and manufacturing time of the SOI substrate can be shortened if the burying diffusion region 104 is removed. Further, the amount of silicon substrate can be reduced.

In this case, however, the resistance between the emitter electrode and the collector electrode will increase. As a result, the required current amount is difficult to secure.

Incidentally, the required current amount can be secured if a total area of the semiconductor device increases. However, the resulting amount of required silicon substrate cannot be reduced.

SUMMARY OF THE INVENTION

It is therefore an object of the present invention to provide a semiconductor device having bipolar transistors that is capable of obviating the above problem.

It is another object of the present invention to provide a semiconductor device having a NPN transistor and a PNP transistor having balanced electrical features.

It is a further object of the present invention to provide a semiconductor device having bipolar transistors that is capable of obtaining required current amount without requiring a burying diffusion region.

According to this invention, an NPN bipolar transistor and a PNP bipolar transistor are formed in a semiconductor substrate. The PNP bipolar transistor has a p type emitter region, a p type collector region and an n type base region and is formed in the PNP forming region. The NPN bipolar transistor has an n type emitter region, an n type collector region and a p type base region and is formed in an NPN forming region. Only one conductive type burying region is formed in at least one of the NPN forming region and the PNP forming region. A current that flows from the p type emitter region to the n type base region flows in the n type base region in a direction perpendicular to the substrate.

Accordingly, respective features of the PNP transistor are fixed because the current flows in a longitudinal direction of the substrate. Therefore, it is possible that the semiconductor device can have the NPN transistor and the PNP transistor having balanced electrical features by using the same substrate and only one conductive type burying region.

Further, a p type well region is formed in the PNP forming region. The n type base region is formed on a surface region of the p type well region and the p type emitter region is formed on a surface region of the n type base region. A distance from a bottom portion of the p type emitter region to the p type well region in the direction perpendicular to the substrate is the shortest distance from the p type emitter region to the p type well region. Therefore, a current between the emitter region and the collector region flows in the direction perpendicular to the substrate via the bottom portion of the emitter region.

According to this invention, an n type suction region is further formed in the well region to suck carriers injected from the n type emitter region. Therefore, the holes injected from the emitter region are sucked by the suction region. As a result, the switching speed of the NPN bipolar transistor becomes high.

According to this invention, a p type diffusion region is formed in the PNP forming region for encompassing the p type collector region. Therefore, it is possible to reduce resistance around the bottom portion of the p type collector region at which a current is especially concentrated. Accordingly, it is possible to secure a high current amplification ratio HFE even if a current flowing between the p type emitter region and the collector region is high.

It is preferable that the p type collector region is formed in a center of the PNP bipolar transistor, and that the n type base region and the p type emitter region are formed around the p type collector region.

It is also preferable the p type emitter region is formed in the center of the PNP bipolar transistor, and that the n type base region and the p type collector region are formed around the p type emitter region.

It is furthermore preferable the p type collector, the n type base region and the p type emitter region are arranged in a stripe-like manner.

Further, it is preferable that the n type collector region is formed in a center of the NPN bipolar transistor, and that the p type base region and the n type emitter region are formed around the n type collector region.

It is also preferable that then type emitter region is formed in the center of the NPN bipolar transistor, and that the p type base region and the n type collector region are formed around the n type emitter region.

BRIEF DESCRIPTION OF THE DRAWINGS

Other objects, features and advantages of the present invention will be understood more fully from the following detailed description made with reference to the accompanying drawings. In the drawings.

DETAILED DESCRIPTION OF THE PREFERRED EMBODIMENT

Figure 1A:
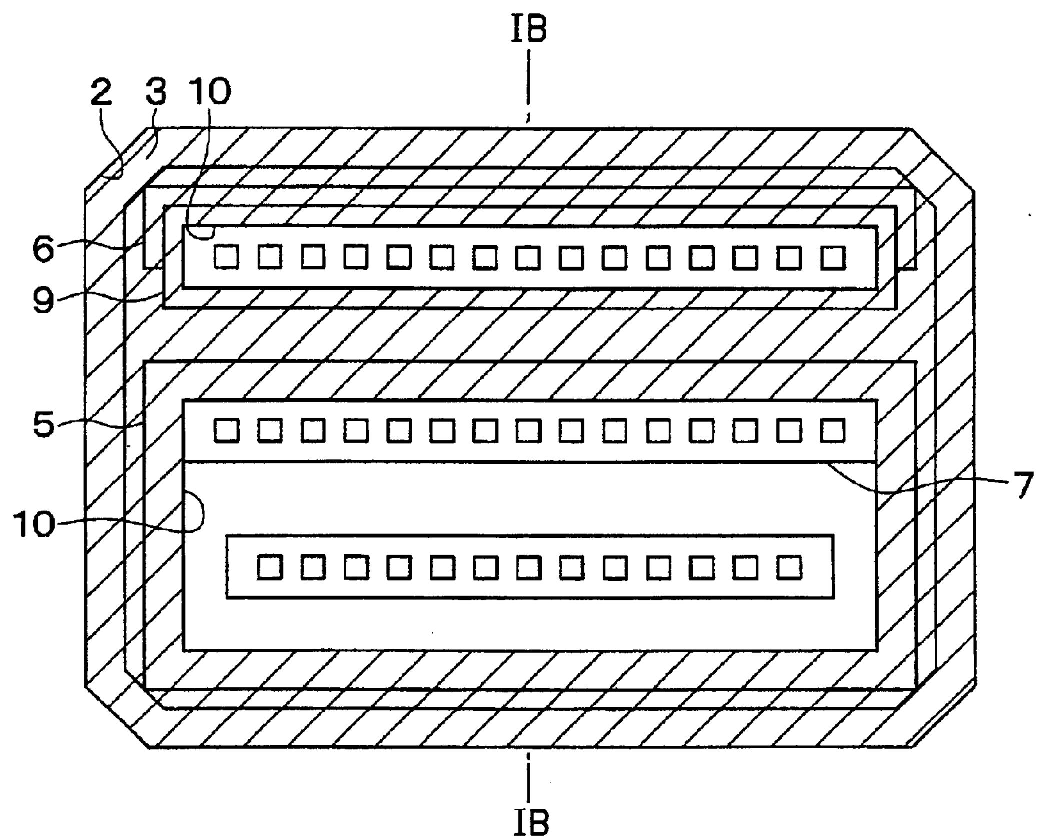
FIG. 1A is a front view showing NPN transistors according to a first embodiment of the present invention.

The present invention will be described further with reference to various embodiments shown in the drawings.

(First Embodiment)

A semiconductor device of this embodiment has NPN transistors and PNP transistors, both of which are formed on the same silicon substrate.

Figure 1B:
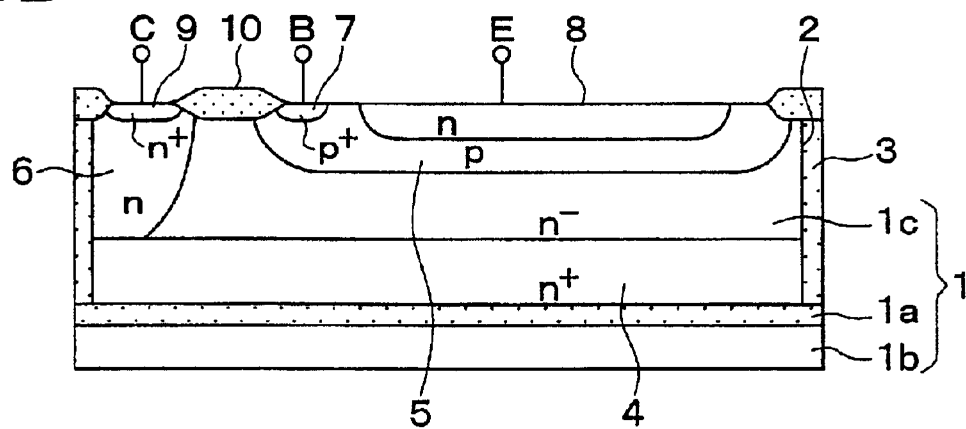
FIG. 1B is a cross sectional view taken along line IB—IB in FIG. 1A.
Figure 2A:
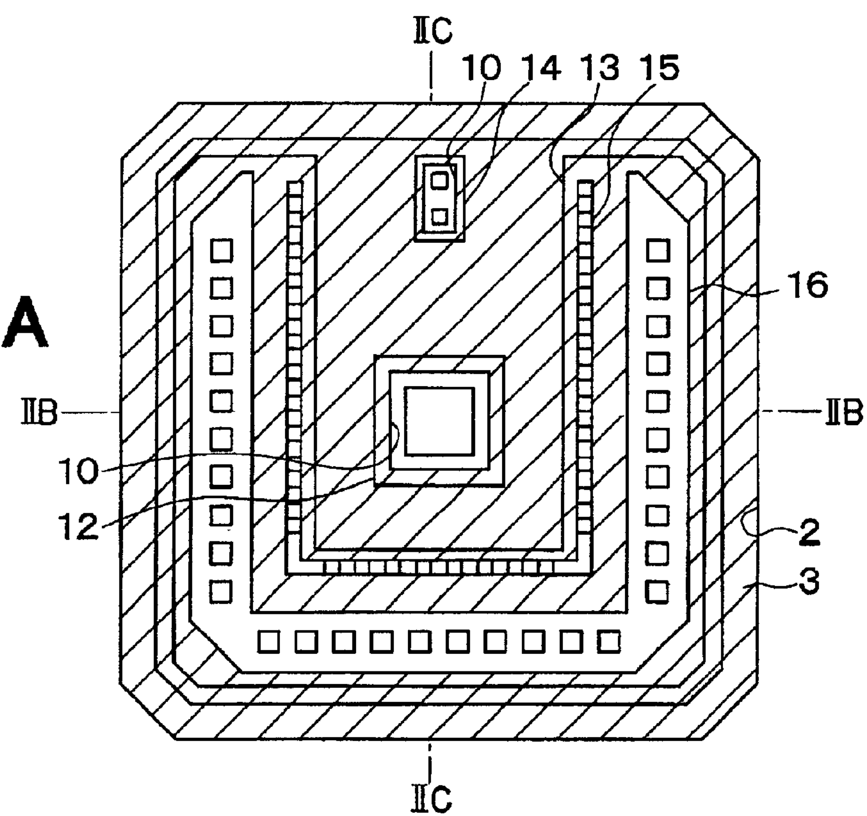
FIG. 2A is a front view showing PNP transistors according to the first embodiment.

Referring to FIGS. 1A, 1B and 2A–2C, the NPN transistors and the PNP transistors are described. Incidentally, in FIGS. 1A and 2A, although some elements are shown with hatching to support visibility, FIGS. 1A and 2A are not cross sectional views (FIGS. 9, 10, 12, 14 and 19 are similar also).

Figure 2B:
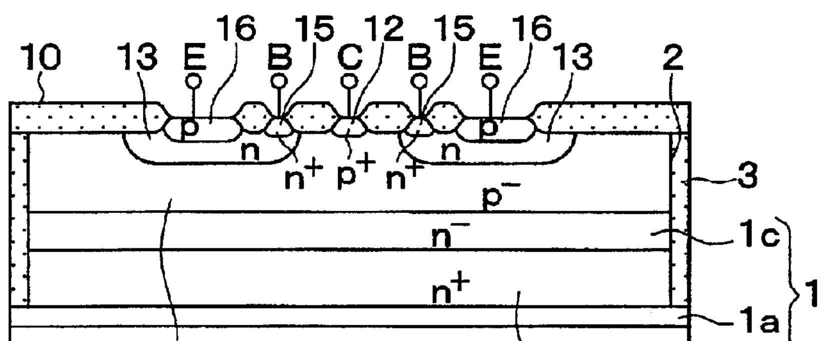
FIGS. 2B, 2C are cross sectional views taken along line IIB—IIB and IIC—IIC in FIG. 2A.
Figure 2C:
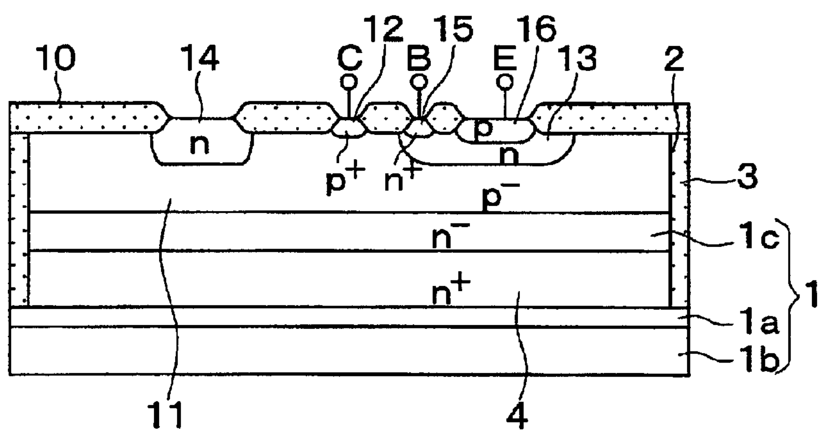

As shown in FIGS. 1B, 2B and 2C, NPN transistors and PNP transistors are formed on an SOI substrate 1. The SOI substrate 1 has a support layer 1*b*, an element forming layer (n− type silicon substrate) 1*c* and a burying oxide layer 1*a* that is disposed between the support layer 1*b* and the element forming layer 1*c*. The element forming layer 1*c* is an activity layer in which trenches 2 and insulation layers 3 are formed. The trenches 2 reach the oxide layer 1*a*, and the insulation layers 3 are formed in the trenches 2. The element forming layer 1*c* is isolated into several regions by the trenches 2 and the insulation layers 3. Hereinafter, the regions on which the NPN transistors are formed are referred to as NPN forming regions. Further, the regions on which PNP transistors are formed are referred to as PNP forming regions.

As shown in FIG. 1B, an n+ type burying region 4 is formed in a lower region of the element forming layer 1*c*. A p type base region 5 is formed in a surface region of the element forming layer 1*c* so as to separate the burying region 4. An n type collector region 6 is formed in the element forming layer 1*c* so as to reach the burying region 4 through the surface region of the element forming layer 1*c*. A p+ type base contact region 7 and an n+ type emitter region 8 are formed in a surface region of the base region 5. Further, an n+ type collector contact region 9 is formed in the surface region of the collector region 6. Respective regions 5–9 are isolated by a LOCOS oxide layer 10 that is formed on the surface of the element forming layer 1*c* as necessary.

As shown in FIG. 1A, in a layout of the NPN transistors, the collector region 6, the collector contact region 9, the base contact region 7 and the emitter region 8 are arranged in a stripe-like and have respective peripheries encircled by the trenches 2 and the isolation layers 3.

As shown in FIGS. 2B, 2C, a p− type well region 11 is formed in the surface region of the element forming layer 1*c*. A p+ type collector region 12, an n type base region 13 and an n type suction region 14 are formed of a surface region of the well region 11 separately from one another. An n+ base contact region 15 and a p+ type emitter region 16 are formed in a surface region of the base region 13. The collector region 12, the base contact region 15, emitter region 16 and the suction region 14 are isolated by the LOCOS oxide layer 10 formed on the surface of the element forming layer 1*c*. Incidentally, the suction region 14 is electrically connected to the emitter region 16 through wiring (not shown).

A distance from the emitter region 16 to the well region 11, which corresponds to a thickness of the base region 13, is the shortest in a direction perpendicular to the SOI substrate 1 from a bottom portion (i.e., in depth of the base region 13). Therefore, a current between the emitter region 16 and the collector region 12 flows via the bottom portion of the emitter region 16, the base region 13, the well region 11 and the collector region 12 in this order. That is, the current flows in a longitudinal direction of the SOI substrate 1.

If the current flows in a lateral direction of the SOI substrate 1, features of the PNP transistors are not fixed depending on accomplishment of the LOCOS oxide layer 10 or respective diffusion regions 12–16. Accordingly, respective features of the PNP transistors are not fixed when several PNP transistors are formed in parallel. However, in this embodiment, respective features of the PNP transistors are fixed because the current flows in a longitudinal direction of the SOI substrate 1.

Further, a distance between the collector region 12 and the emitter region 16 is less than 20 $\mu$m. Therefore, it is possible to shorten the distance between the collector region 12 and the emitter region 16.

Referring to FIG. 2A, in the PNP transistors having the above-mentioned construction, the collector region 12 is arranged in the center, and the base region 13, the base contact region 15 and the emitter region 16 are formed around the collector region 12. However, the base region 13, the base contact region 15 and the emitter region 16 are not formed partially around the collector region 12 where the suction region 14 is formed.

According to this embodiment, in the NPN transistors, it is possible realize greater current flow because collector resistance decreases due to the burying region 4.

On the other hand, in the PNP transistors, it is possible that collector resistance relatively decreases because the distance between the collector region 12 and the emitter region 16 is shortened even if a p type burying region does not exist. Further, a switching speed may possibly become low because holes having longer lifetimes than electrons are used as carriers. However, the holes injected from the emitter region 16 are sucked by the suction region 14. As a result, the switching speed becomes high.

Accordingly, in the above-mentioned construction, it is possible to accelerate the switching speed of the PNP transistors to a speed close to that of the NPN transistors even if the burying region is not formed in the PNP forming regions. In this construction, namely, it is possible that the semiconductor device has the NPN transistors and the PNP transistors having balanced electrical features by using the same substrate and only one conductive type burying region.

The semiconductor device of this embodiment is, for example, manufactured as follows. First, ion implantation is conducted into the surface of the element forming layer 1*c* after the SOI substrate 1 is prepared to formed the burying region 4 in the NPN forming regions and PNP forming regions. Next, in the PNP forming region, the well region 11 is formed by ion implantation or the like, and the base region 13 and the suction region 14 are formed simultaneously by ion implantation or the like. In the NPN forming region, the collector region 6 and the base region 5 are formed. Subsequently, the LOCOS oxide layer 10 is formed by well-known LOCOS oxidation, and thereafter the collector contact region 9 in the NPN forming region and the base contact region 15 in the PNP forming region are simultaneously formed using a predetermined mask. Then, the base contact region 7 in the NPN forming region and the collector region 12 and the emitter region 16 in the PNP forming region are simultaneously formed using predetermined mask. Also, a passivating layer forming process, a wiring forming process and the like are conducted to produce the semiconductor device.

(Second Embodiment)

Figure 3:
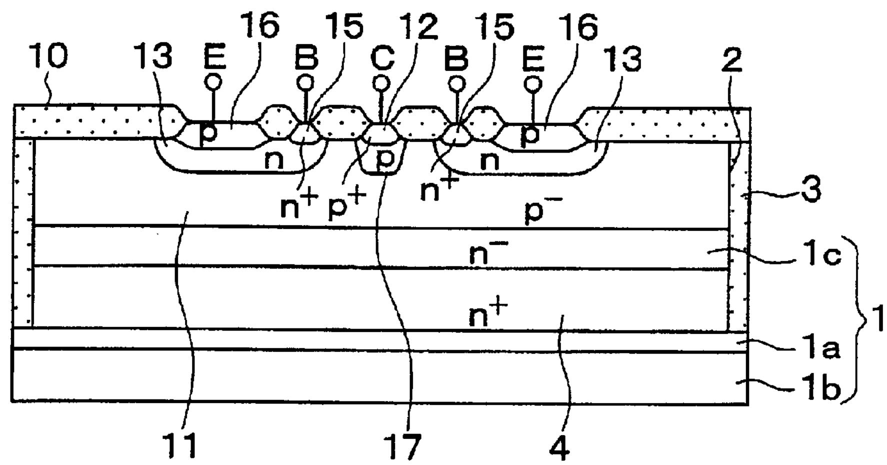
FIG. 3 is a cross sectional view showing PNP transistors according to a second embodiment of the present invention.

A semiconductor shown in FIG. 3 represents a modification of the first embodiment. As shown in FIG. 3, in this embodiment, PNP transistors are modified with respect to PNP transistors in the first embodiment.

In a PNP forming region, a p type region 17 is formed in the surface region of an element forming layer 1*c*. An impurity concentration of the p type region 17 is more than a well region 11 and less than a collector region 12. The collector region 12 is encompassed in the p type region 17. It is possible to reduce resistance around the bottom portion of the collector region 12 at which a current is especially concentrated. Accordingly, it is possible to secure a high current amplification ratio HFE even if a current flowing between an emitter region 16 and the collector region 12 is high.

Figure 4:
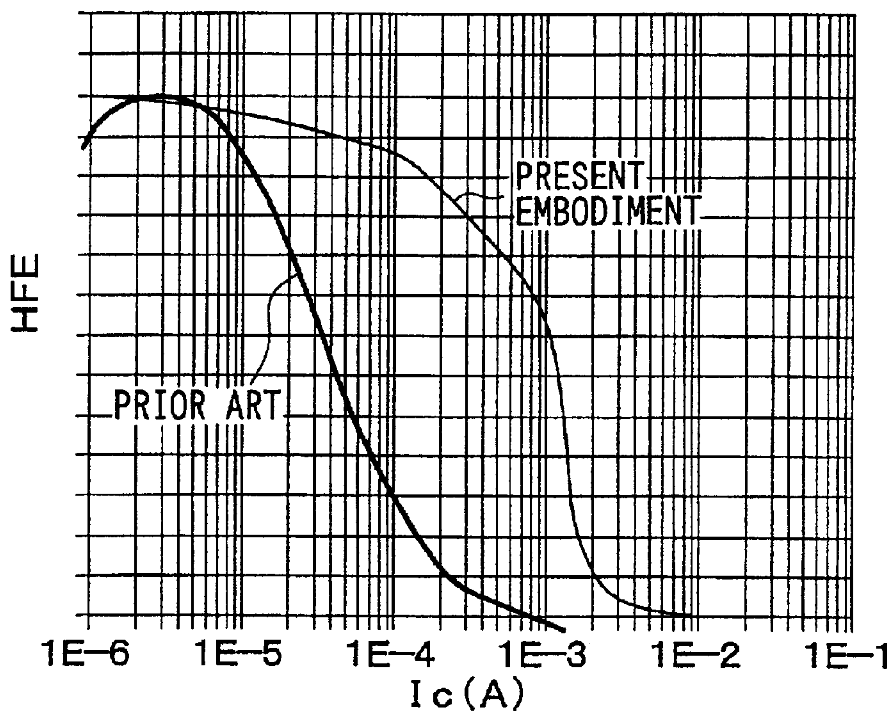
FIG. 4 is line graph showing relationships between collector currents Ic and current amplification ratios HFE with respect to the second embodiment and a prior semiconductor device.

FIG. 4 shows a relationship between the collector current Ic and the current amplification ratio HFE of this embodiment and prior lateral-type PNP transistors resulting from a simulation analysis. As shown graphically, a high current amplification ratio HFE is secured in the wide collector current range with the present embodiment.

Figure 5A:
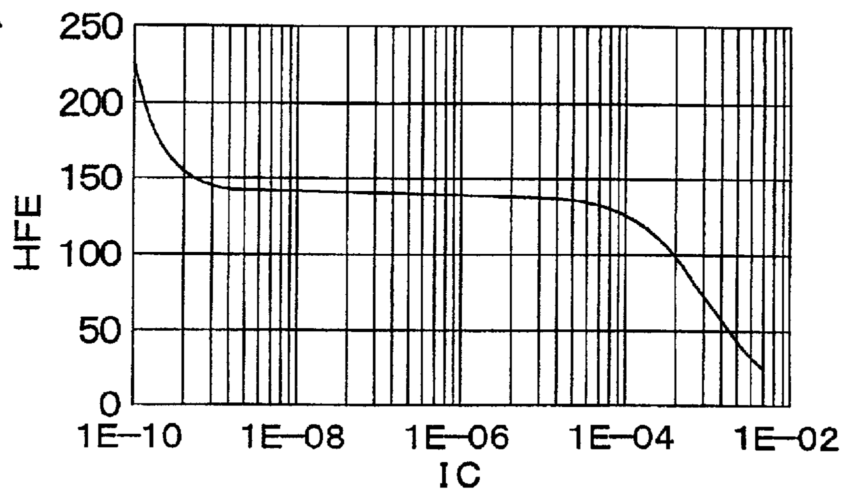
FIGS. 5A, 5B are line graphs showing relationships between collector currents Ic and current amplification ratios HFE with respect to the second embodiment and a prior semiconductor device.
Figure 5B:
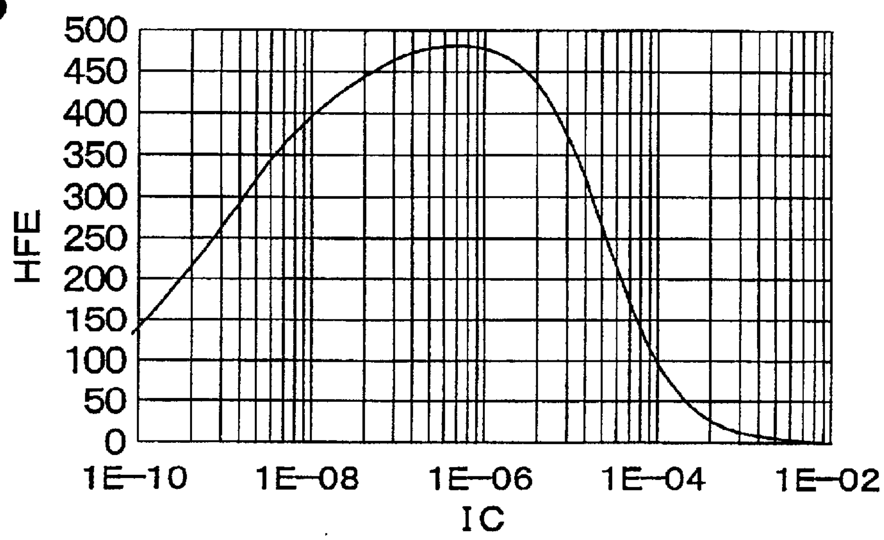

As shown in FIG. 5A, the semiconductor device of this embodiment is able to secure a fixed current amplification ratio HFE in practical use (corrector current Ic: 1 to 10 $\mu$m). To the contrary, prior semiconductor devices are typically unable to secure such a fixed current amplification ratio HFE. Those two type semiconductors shown in FIGS. 5A, 5B are employed as elements of a current mirror circuit shown in FIG. 5C. FIG. 6 shows a relationship between emitter resistance and output current Iout. A broken line shows the ideal value.

Figure 5C:
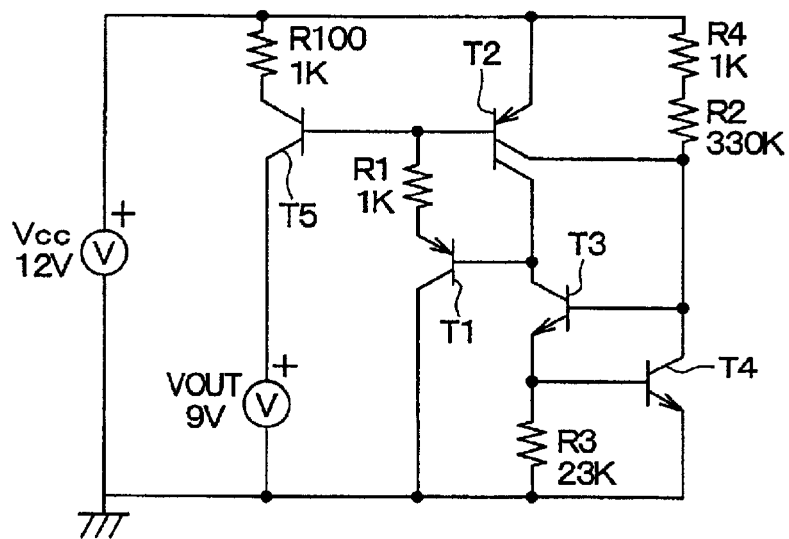
FIG. 5C is electrical circuit diagram showing a current mirror circuit using NPN transistors and PNP transistors of the second embodiment.
Figure 6:
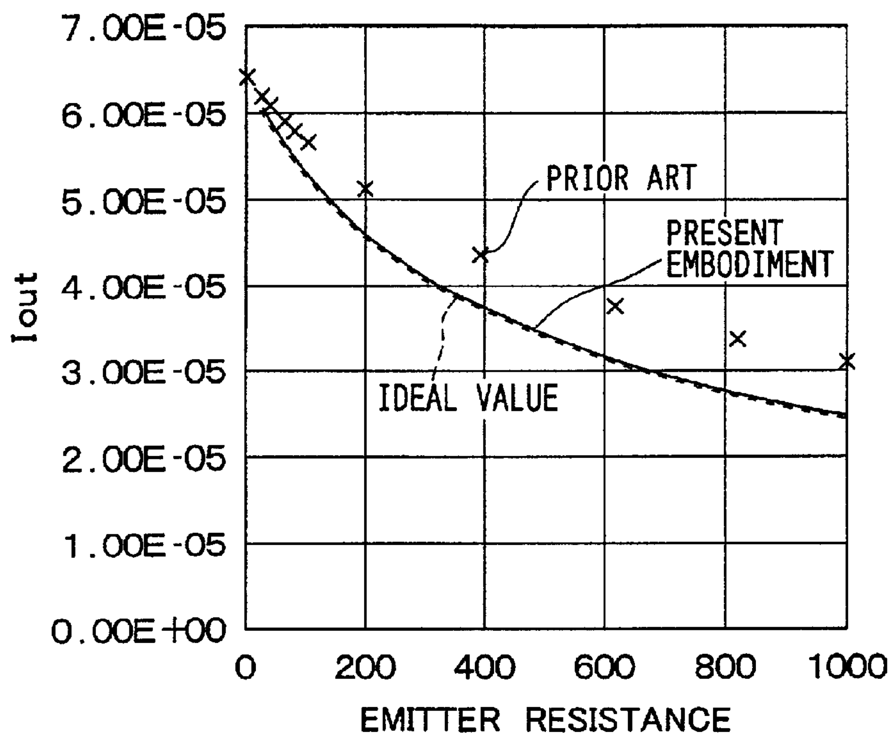
FIG. 6 is line graph showing relationships between emitter resistances and current outputs Iout with respect to the second embodiment and a prior semiconductor device.

As shown in FIG. 5C, in the prior semiconductor, the higher the emitter resistance becomes, the more the current output Iout separates from the ideal value. However, in the semiconductor of this embodiment, the current output Iout is approximately equal to the ideal value. In this way, current mirror accuracy can be high when the current mirror circuit shown in FIG. 5C is adopted.

(Third Embodiment)

Figure 7:
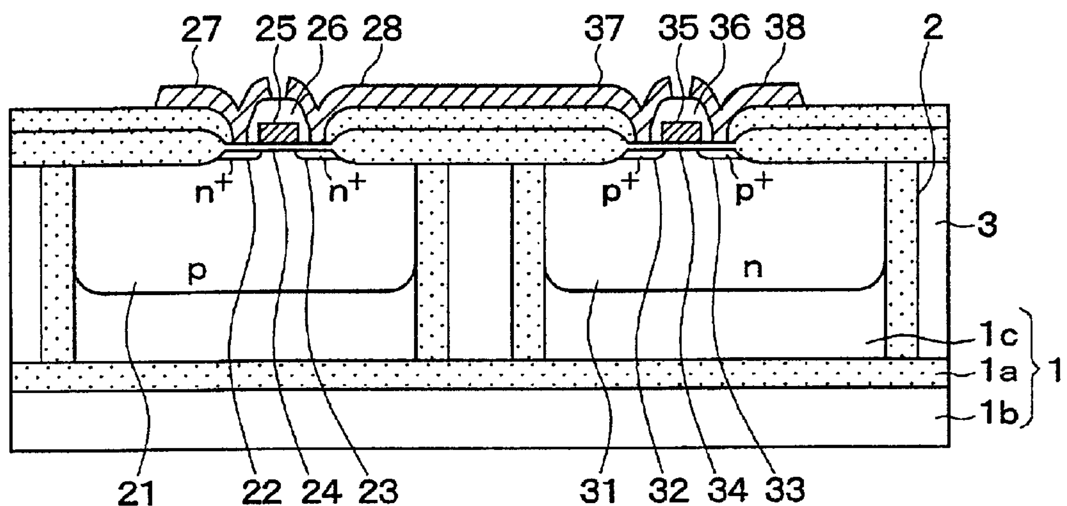
FIG. 7 is cross sectional view showing a CMOS according to a third embodiment of the present invention.

Referring to FIG. 7, another embodiment is shown in which a CMOS is formed with the NPN transistors and the PNP transistors of the first or the second embodiment in the same SOI substrate 1. The CMOS has an NMOS transistor and the PMOS transistor. The NMOS transistor and a PMOS transistor are insulated by trenches 2 and isolation layers 3. Hereinafter, a region on which the NMOS transistor is formed is referred to as NMOS forming region. Further, a region on which PMOS transistor is formed is referred to as PNP forming region.

In the NMOS forming region, a p− type well region 21 is formed in a surface region of an element forming layer 1*c*. Also, an n+ type source region 22 and n+ drain region 23 are formed in a surface region of the well region 21 separately from one another.

If a region between the source region 22 and the drain region 23 is referred to as channel region, a gate insulation layer 24 is formed on the gate channel region, and a gate electrode 25 is formed on the insulation layer 24. A passivating layer 26 covers the gate electrode 25 or the like. The passivating layer 26 has a plurality of contact holes through which a source electrode 27 connects to the source region 22 and a drain electrode 28 connects to the drain region 23.

In the PMOS forming region, an n− type well region 31 is formed in the surface region of the element forming layer 1*c*. Also, a p+ type source region 32 and p+ drain region 33 are formed in a surface region of the well region 31 separately from one another.

If a region between the source region 32 and the drain region 33 is referred to as channel region, a gate insulation layer 34 is formed on the channel region, and a gate electrode 35 is formed on the gate insulation layer 34. A passivating layer 36 covers the gate electrode 35 or the like. The passivating layer 36 has a plurality of contact holes through which a source electrode 37 connects to the source region 32 and a drain electrode 37 connects to the drain region 33.

When the CMOS having such construction is formed on the same SOI substrate 1 with the NPN transistors and the PNP transistors, manufacturing processes of respective transistors can be shared. Specifically, the well region 21 in the NMOS forming region and the well region 11 in the PNP forming region can be formed by the same process. The source region 22 and the drain region 23 in the NMOS forming region, the collector region 9 and emitter region 8 in the NPN forming region, and the base contact region 15 in the PNP forming region can be formed by the same process. Further, the source region 32 and the drain region 33 in the PMOS forming region, the base contact region 7 in the NPN forming region, and the collector region 12 and the emitter region 16 in the PNP forming region can be formed by the same process. Also, a gate insulation layer forming process, a gate electrode forming process, a passivating layer forming process and a wiring forming process can also be shared.

In this way, when the manufacturing processes of the CMOS, NPN transistors and PNP transistors are shared, it is unnecessary to add other processes with the first embodiment for forming the CMOS.

(Fourth Embodiment)

Figure 8:
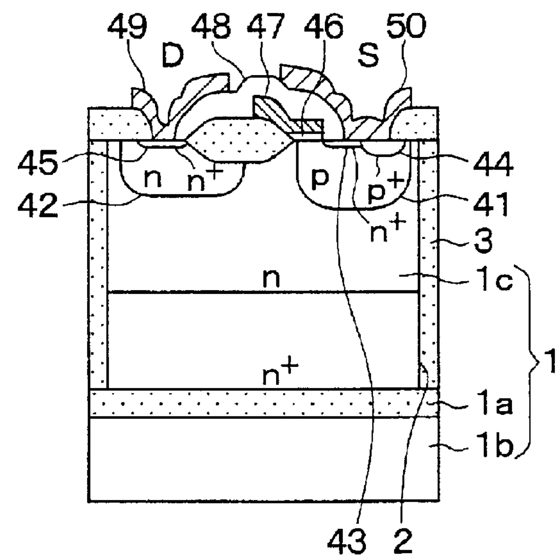
FIG. 8 is cross sectional view showing an LDMOS according to a fourth embodiment of the present invention.

Referring to FIG. 8, an embodiment is shown in which an LDMOS is formed with the NPN transistors, the PNP transistors and the CMOS of the third embodiment in the same SOI substrate 1. As shown in FIG. 8, the LDMOS is insulated by trenches 2 and isolation layers 3. Hereinafter, a region on which the LDMOS is formed is referred to as an LDMOS forming region.

In the element forming layer 1*c* of the LDMOS forming region, a p type channel region 41 and an n type well region 42 are formed separately from one another. An n+ type source region 43 and p+ type base contact region 44 are formed in a surface region of the channel region 41. An n+ type drain region 45 is formed in a surface region of the well region 42. A gate insulation layer 46 and a gate electrode 47 is formed on a surface of the channel region 41 sandwiched between the source region 43 and the element forming layer 1*c*. A passivating layer 48 covers the gate electrode 47 or the like. The passivating layer 48 has a plurality of contact holes through which a source electrode 49 connects to the source region 43 and a drain electrode 50 connects to the drain region 45.

When the LDMOS having such construction is formed on the same SOI substrate 1 with the NPN transistors, the PNP transistors and the CMOS, manufacturing processes of respective transistors can be shared. Specifically, the channel region 41 in the LDMOS forming region and the base region 5 in the NPN forming region can be formed by the same process. The well region 42 in the LDMOS forming region and the base region 13 in the PNP forming region can be formed by the same process. The source region 43 and drain region 45 in the LDMOS forming region, the collector contact region 9 and emitter region 8 in the NPN forming region, and base contact region 15 in the PNP forming region can be formed by the same process. The base contact region 44 in the LDMOS forming region, the base contact region 7 in the NPN forming region, and the collector region 12 and the emitter region 16 in the PNP forming region can be formed by the same process. Further, a gate insulation layer forming process, a gate electrode forming process, a passivating layer forming process and a wiring forming process can also be shared.

In this way, when the manufacturing processes of the LDMOS, CMOS, NPN transistors and PNP transistors are shared, it is unnecessary to add other processes with the third embodiment for forming the LDMOS.

(Fifth Embodiment)

Figure 9:
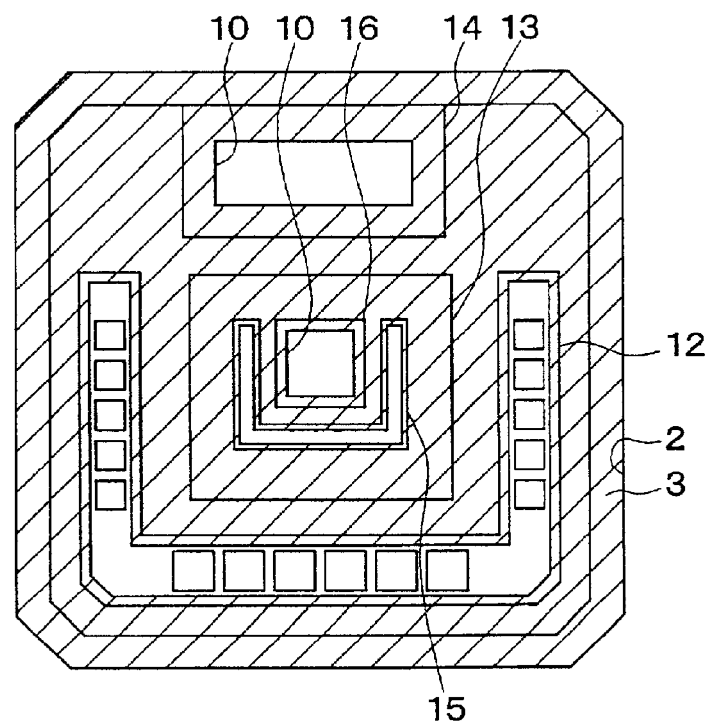
FIG. 9 is a front view showing PNP transistors according to a fifth embodiment of the present invention.

Referring to FIG. 9, an embodiment is shown in which PNP transistors have a different layout from the first to fourth embodiments.

In the PNP transistors, an emitter region 16 is arranged in the center, and a collector region 12, a base region 13 and a base contact region 15 are formed around the emitter region 16. In this construction, it is possible to obtain the same advantages of the first to fourth embodiments.

(Sixth Embodiment)

Figure 10:
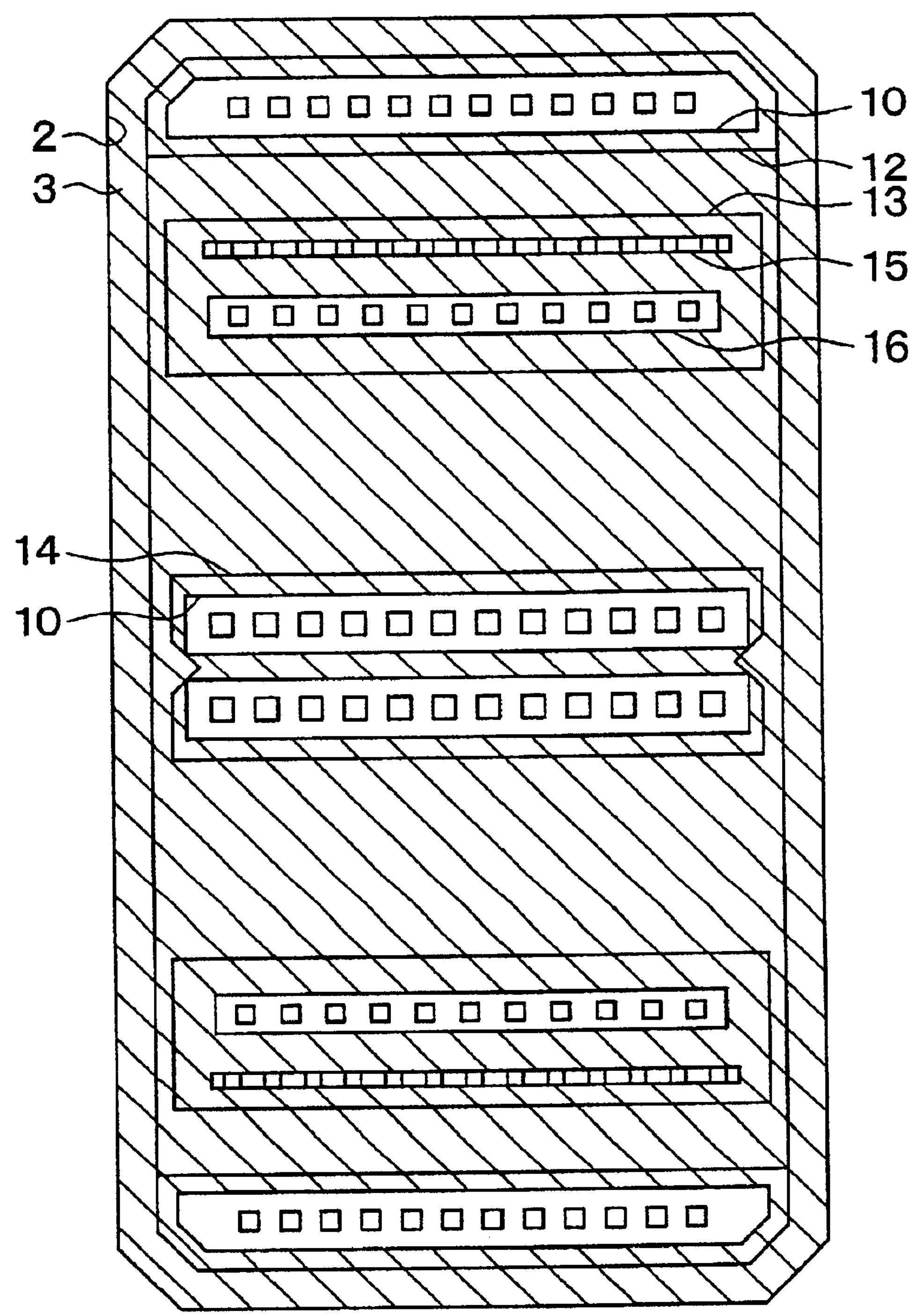
FIG. 10 is a front view showing PNP transistors according to a sixth embodiment of the present invention.

In FIG. 10, an embodiment is shown in which PNP transistors have a different layout from the first to fifth embodiments.

In the PNP transistors, a collector region 12, a base region 13, an emitter region 16 and a suction region 14 are arranged in a stripe-like manner. In this construction, it is also possible to obtain the same advantages of the first to fourth embodiments.

In FIG. 10, two cells of PNP transistors having the same constitution are disposed in the same PNP forming region. The collector region 12, the base region 13, the emitter region 16 and the suction region 14 are provided for both cells, and the collector region 12, the base region 13, the emitter region 16 are symmetrically arranged around the suction region 14, which acts as a symmetry center.

Figure 11:
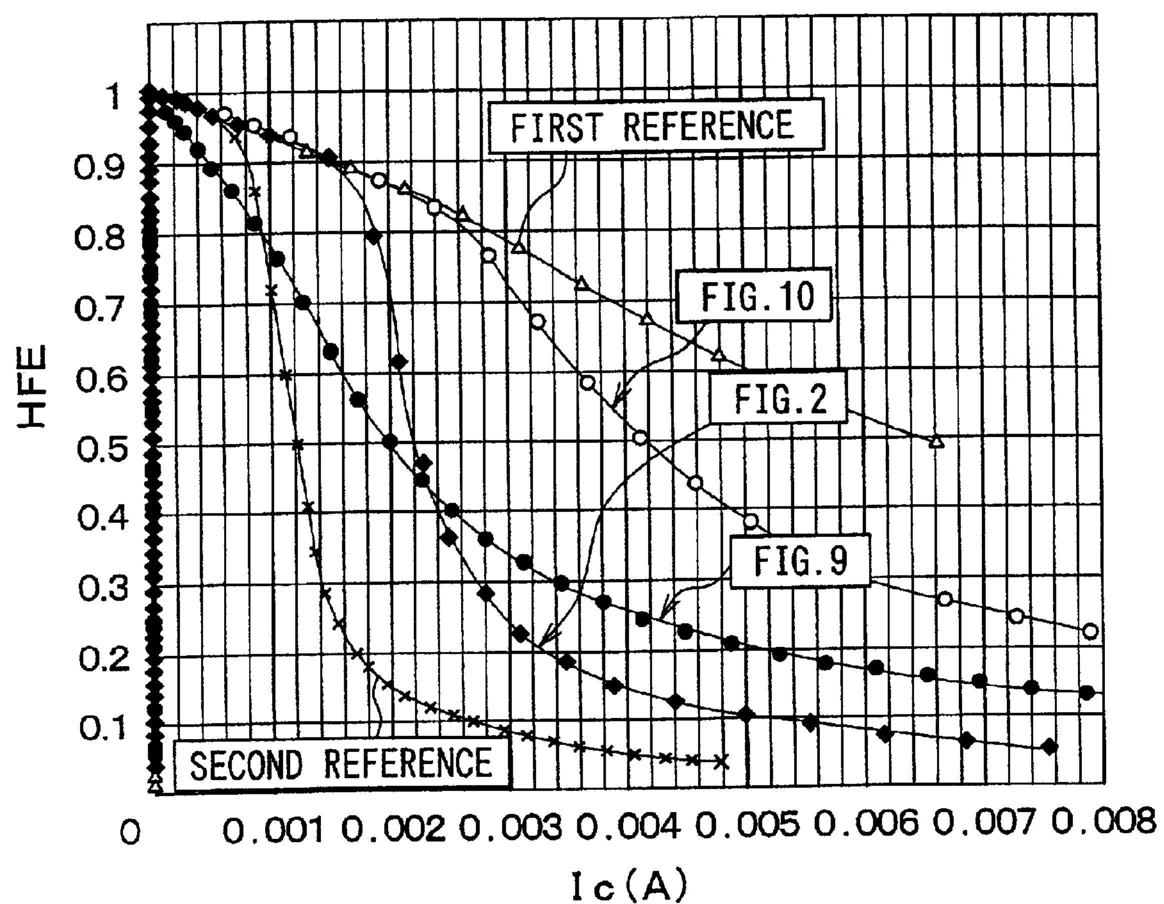
FIG. 11 is line graph showing relationships between collector currents Ic and standardized current amplification ratios HFE with respect to various transistors including FIGS. 2, 9 and 10.

Incidentally, a layout of the PNP transistors is appropriately chosen depending on required features. For example, the layout may be chosen depending on features of the NPN transistors that are formed on the same substrate as the PNP transistors so that the PNP transistors have fixed features balanced with the NPN transistors. Empirical data of relationships between collector current Ic and standardized current amplification ratios HFE are shown in FIG. 11. The relationships correspond to respective PNP transistors shown in FIGS. 2, 9 and 10 and two references. A first reference is a PNP transistor having a p+ type burying region provided for a prior semiconductor device and a p type region 17 of the second embodiment (FIG. 3), and a second reference is a PNP transistor that does not have the p+ type burying region and the p type region 17.

As shown in FIG. 11, all of the standardized current amplification ratios HFE of the PNP transistors shown in FIGS. 2, 9 and 10 are greater than that of the second reference. Also, features of the PNP transistors shown in FIGS. 2, 9 and 10 are similar to features of the first reference. Especially, the PNP transistors arranged in a stripe-like layout have the closest features compared to the features of the first reference. In this way, if the layout of the PNP transistors is appropriately chosen depending on required features, it is possible to obtain the PNP transistors having balanced features relative to NPN transistors. Therefore, it is possible to obtain an appropriately complementary device.

(Seventh Embodiment)

Figure 12:
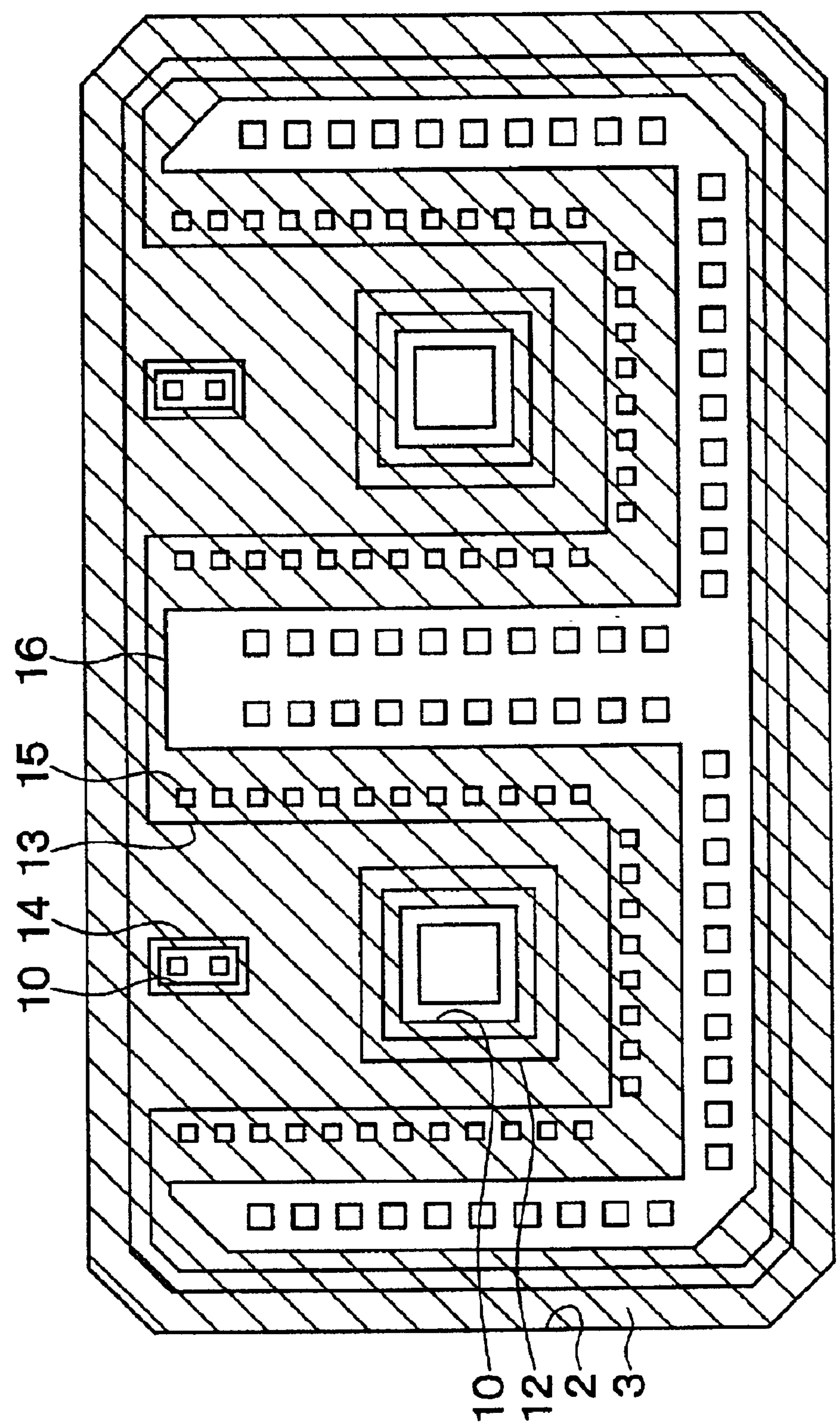
FIG. 12 is a front view showing NPN transistors according to a seventh embodiment of the present invention.

In the embodiment shown in FIG. 12, PNP transistors have a different layout from the first to sixth embodiments. In the PNP transistors, respective elements are repeatedly arranged in a predetermined serial manner.

If a large current is required, a total area of a base region 3 and an emitter region 16 must typically be increased. However, in this case, the internal resistance might be great because a distance of a well region 11 in which a current would flow is long. To the contrary, this disadvantage may be avoided by adopting the layout of this embodiment.

(Eighth Embodiment)

Figure 13A:
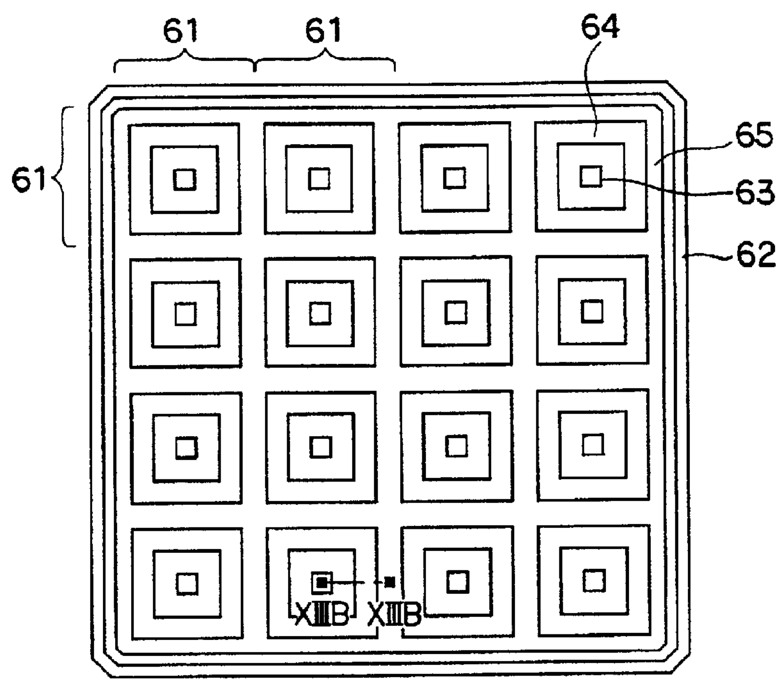
FIG. 13A is a front view showing NPN transistors according to an eighth embodiment of the present invention.
Figure 13B:
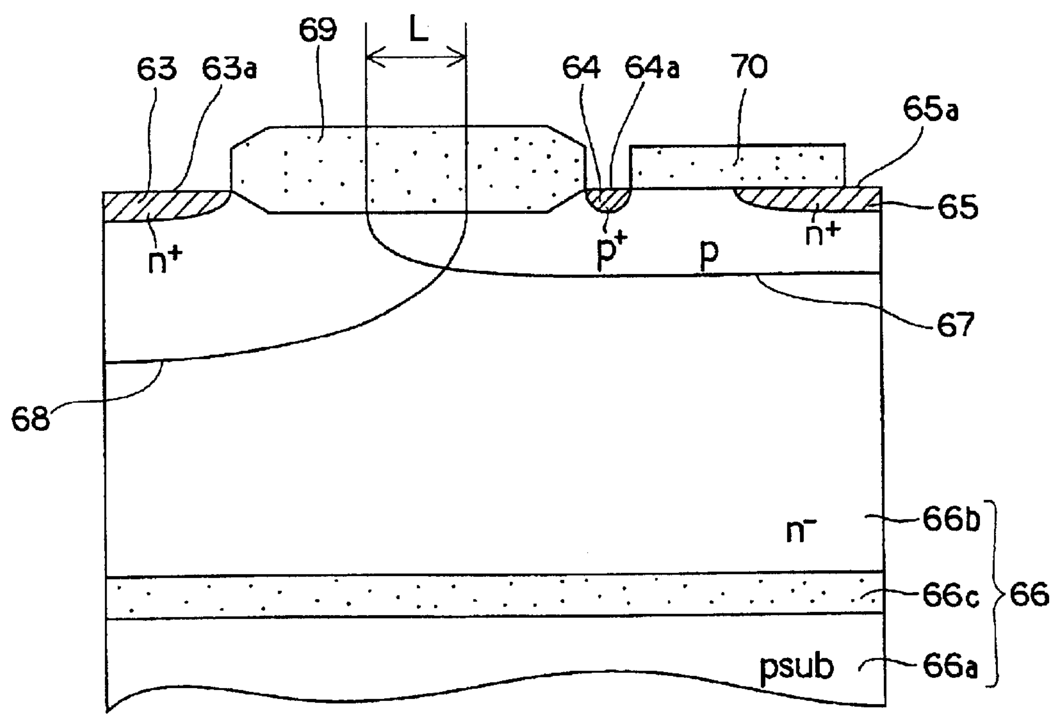
FIG. 13B is a cross sectional view taken along line XIIIB—XIIIB in FIG. 13A.

In the embodiment in FIGS. 13A–13B, NPN transistors have a different structure than the first to seventh embodiments. Referring to FIG. 13A, plurality of unit cells 61 exist and a periphery thereof is encircled by trenches 62. Respective unit cells 61 have a collector region 63, a base contact region 64 and an emitter region 65. In a layout of the unit cell 61, the collector region 63 is arranged in the center of the unit cell 61 so as to be encircled by the base contact region 64 and the emitter region 65 in this order.

As shown in FIG. 13B, NPN transistors are formed on an SOI substrate 66. The SOI substrate 66 has a support layer 66*a*, an element forming layer 66*b* and a burying oxide layer 66*c* that is disposed between the support layer 66*a* and the element forming layer 66*b*. The SOI substrate 66 has no burying diffusion region, and a thickness of the element forming layer 66*b* is at least 6 μm.

Channel diffusion regions (base regions) 67 are formed at a periphery position of the surface region of the element forming layer 66*b* so as to encircle respective collector regions 63. That is, when viewed from front side of the SOI substrate 66, respective channel diffusion regions 67 are arranged in like square-shape so that respective collector regions 63 are arranged in the center of respective unit cells 61. The channel diffusion regions 67 are p type conductive.

The emitter regions 65 are formed at a periphery position of the surface region of the channel diffusion regions 67. When viewed from front side of the SOI substrate 66, the emitter regions 65 are arranged in like square-shape so that respective collector regions 63 are arranged in the center of respective unit cells 61. The emitter regions 65 are n type conductive that is formed by ion diffusion.

The channel diffusion regions 67 and the emitter regions 65 are shared with adjacent unit cells 61.

A width of the emitter regions 65 in a direction from the center of respective unit cells 61 to a periphery side thereof is at least 2 μm. That is, the current amplification ratios HFE of respective NPN transistors have wide dispersion due to manufacturing accuracy of the NPN transistors, thereby depressing the bipolar feature. Accordingly, it is preferable that the width of the emitter region 65 is at least 2 μm. Incidentally, the preferable width of the emitter regions 65 depends on a size of the unit cells 61, but is generally less than 15 μm.

The base contact regions 64 are formed in the surface portion of the channel diffusion region 67 in the center side of the unit cells 61. The base contact regions 64 are p+ type conductive.

The collector regions 63 are formed in the surface region of the element forming layer 66*b* in the center side of the unit cells 61. The collector regions 63 are n+ type conductive. Further, an n type second diffusion region (hereinafter referred to as an AD Nwell region) 68, which is high impurity concentration, is formed so as to encompass the collector regions 63. The impurity concentration of the AD Nwell region 68 is $5\times10^{16}$ $cm^{-3}$ to $1\times10^{17}$ $cm^{-3}$.

The AD Nwell region 68 overlaps with the channel diffusion region 67. The overlap length L is more than 0 $\mu$m to 2 $\mu$m or less. The overlap length L is a distance from an end of the AD Nwell region 68 to an end of the channel diffusion region 67 on a surface of the SOI substrate 66.

A LOCOS oxide layer 69 is formed on the surface of the SOI substrate 66 to cover between the channel diffusion region 67 and the collector region 63 and to encircle the collector region 63. Also, a passivating layer 70 is formed on the surface of the SOI substrate 66. The passivating layer 70 is, for example, made of a BPSG layer and opens on a base contact surface 64*a,* a collector contact surface 63*a* and an emitter contact surface 65*a.*

Figure 14:
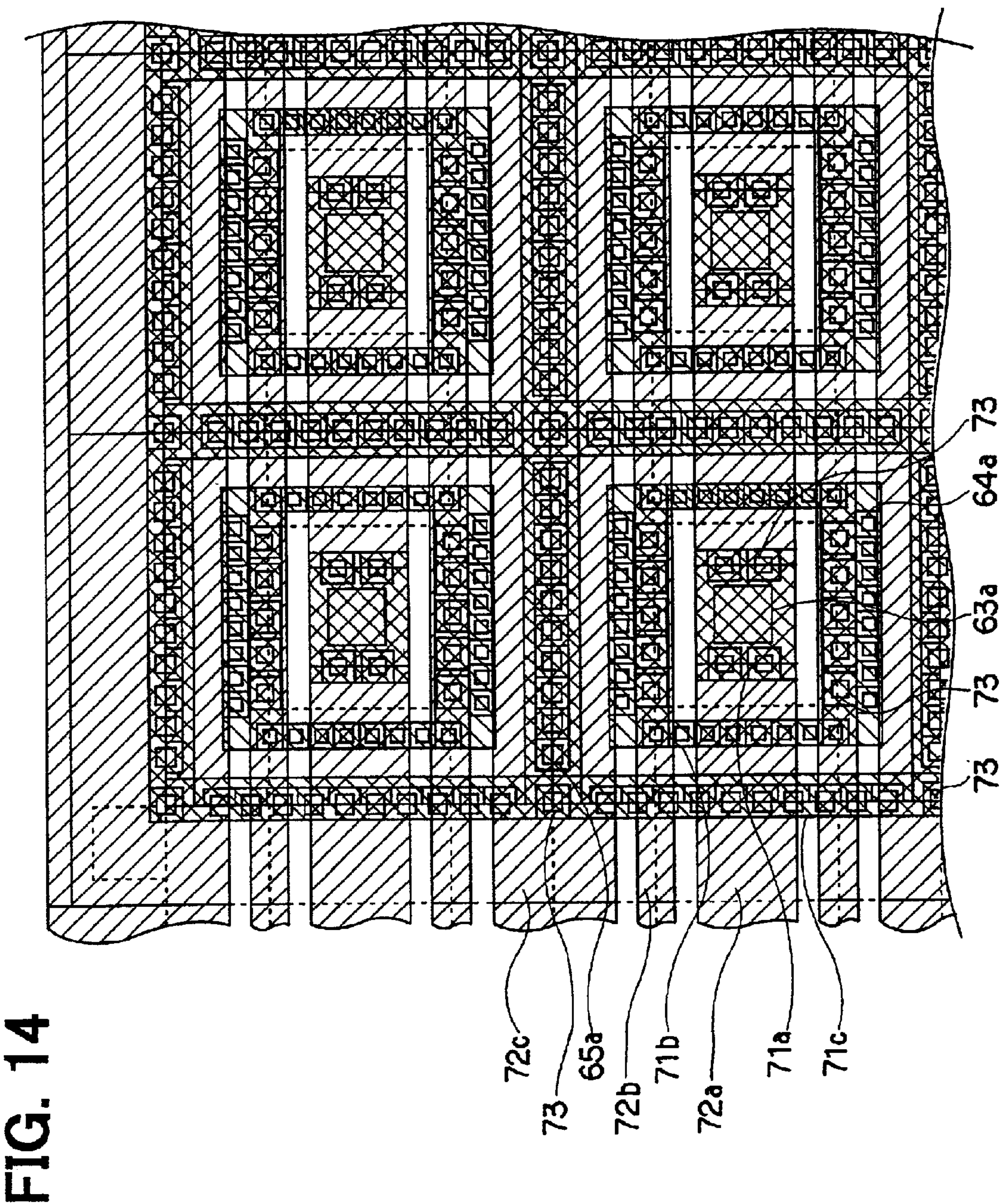
FIG. 14 is a layout view showing the NPN transistors according to the eighth embodiment.

Wiring layers made of metal (e.g., aluminum) or the like are formed on the surface of the SOI substrate 66. FIG. 14 shows the wiring layers 71*a*–71*c* and 72*a*–72*c* using hatching. The wiring layers are constructed by first wiring layers 71*a*–71*c* and second wiring layers 72*a*–72*c.* The second wiring layers 72*a*–72*c* are formed on a passivating layer that is formed on the first wiring layers 71*a*–71*c.*

The first wiring layers 71*a*–71*c* include collector wiring layers 71*a* formed over the collector region 63, base wiring layers 71*b* formed over the base contact region 64 and emitter wiring layers 71*c* formed over the emitter region 65. Respective collector wiring layers 71*a* are rectangular and contact the collector contact surface 63*a.* Respective base wiring layers 71*b* are loop shape and contact to the base contact surface 64*a.* Respective emitter wiring layers 71*c* are also loop-shaped in which the collector and the base wiring layers 71*a,* 71*b* are formed and contact the emitter contact surface 65*a.* Respective emitter wiring layers 71*c* are connected each other in a mesh like manner.

The second wiring layers 72*a*–72*c* include a collector wiring layer 72*a,* a base wiring layer 72*b* and an emitter wiring layer 72*c.* The collector, the base and the emitter wiring layers 72*a*–72*c* are stripe-shaped to respectively contact all collector, base and emitter wiring layers 71*a*–71*c* through contact holes formed on the passivating layer.

A manufacturing method of the NPN transistors will now be described. First, the SOI substrate 66 is prepared, and thereafter the trenches 62 are formed on the surface thereof. The AD Nwell region 68 is formed by impurities doping to the element forming layer 66*b*. The LOCOS oxide layer 9 is formed on the element forming layer 66*b,* and thereafter the channel diffusion region 7 is formed by impurity doping using the LOCOS oxide layer as a mask. Subsequently, a resist pattern is formed on the surface of the SOI substrate 66 through which impurity doping is conducted, thereby forming the base contact region 64 and the emitter region 65 and the collector region 63.

The passivating layer 70 is formed on the surface of the SOI substrate 66 using an oxide layer (e.g., BPSG) and is reformed in a predetermined pattern to open on the base, the emitter and the collector contact surfaces 64*a,* 63*a* and 65*a.* The first wiring layers 6l*a*–61*c* are formed on the SOI substrate 66 and the passivating layer 61. Further, the second wiring layers 72*a*–72*c* are formed on the SOI substrate 66 and the first wiring layers 61*a*–61*c* through the passivating layer. In this manner, the NPN transistors of this embodiment are completed.

According to this embodiment, respective opposing lengths of the collector region 63 and the emitter region 65 can be lengthened because the emitter region 65 encircles the collector region 63. As a result, a cross sectional area in which a current flow can be enlarged, so that a long current can flow between the emitter region 65 and the collector region 63. Therefore, it is possible to obtain a required current amount without the burying diffusion region.

Also, the AD Nwell region 68 that is formed to encompass the collector region 63 has a high impurity concentration. Therefore, a resistance between the emitter electrode (61*c*) and collector electrode (61*a*) decreases as the prior semiconductor device with burying diffusion region, thereby enabling more current to flow.

Figure 15:
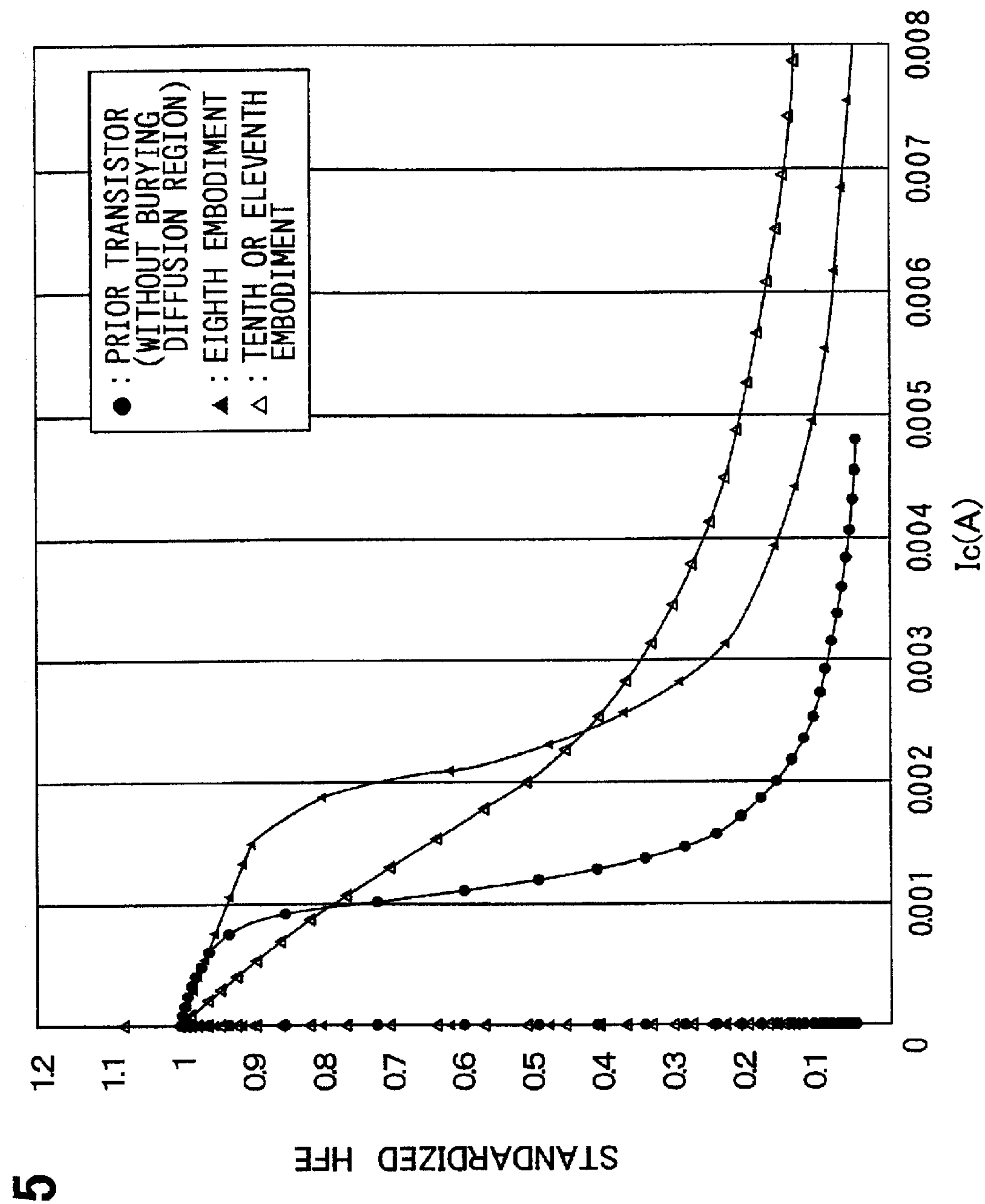
FIG. 15 is line graph showing relationships between collector currents Ic and current amplification ratios HFE of various transistors.

Experimental results with respect to relationships the current amplification ratios HFE and collector currents Ic are shown in FIG. 15. Incidentally, the current amplification ratios HFE shown in FIG. 15 are standardized when a maximum HFE is normalized to one.

As shown in FIG. 15, larger current flow can be achieved with the NPN transistors of this embodiment than prior transistors without the burying diffusion region.

Incidentally, FIG. 15 shows experimental results with respect to NPN transistors mentioned in the tenth or the eleventh embodiment. In the NPN transistors of the tenth or the eleventh embodiment, an emitter region 65 is arranged in the center and is encircled with a collector region 63 and base contact region 64. When compared respective collector currents Ic of this embodiment are compared to that of the tenth or eleventh embodiment at 70% of the maximum HFE (i.e., HFE is 0.7) that indicates standard capability for flowing current, the former is greater than the latter. This is because a substantial area of the emitter region 65 of this embodiment is larger than that of the tenth or the eleventh embodiment.

Figure 16A:
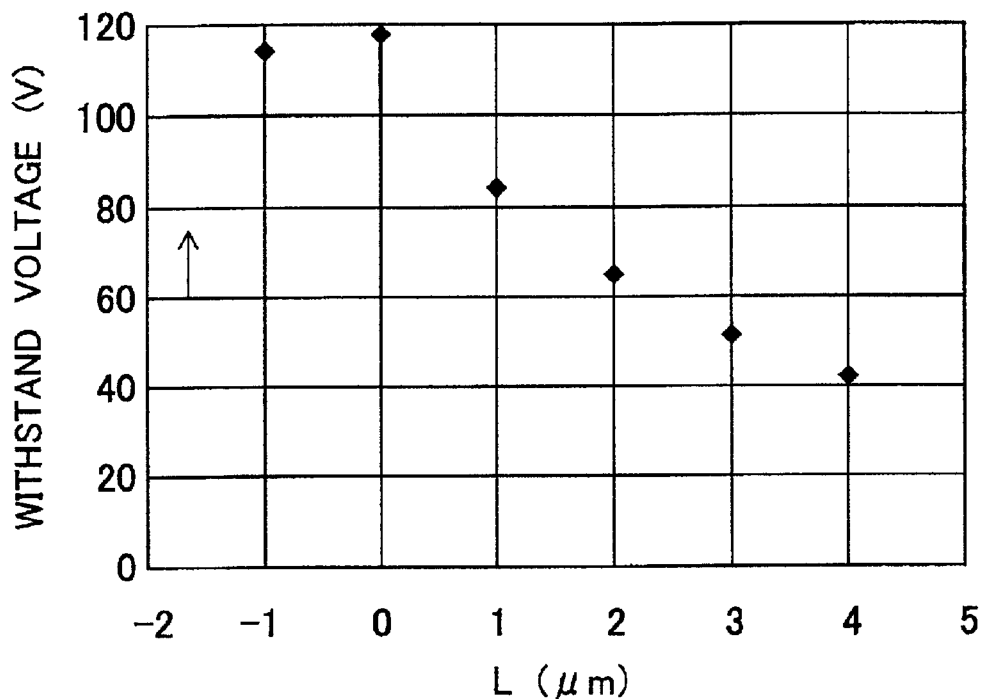
FIG. 16A is a data plot graph showing relationships between withstanding voltages and overlap lengths L between a channel region and an AD Nwell regions according to the eighth embodiment.
Figure 16B:
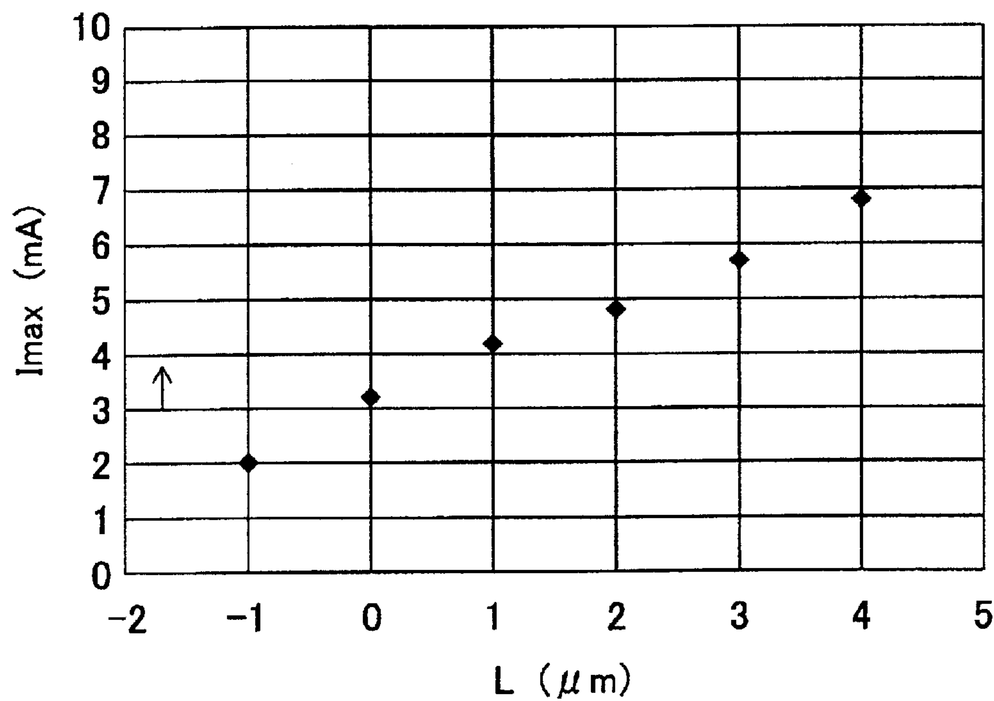
FIG. 16B is data plot graph showing relationships between maximum value of collector current Imax and overlap lengths L between a channel region and an AD Nwell regions according to the eighth embodiment.

Further, the overlap length L between the AD Nwell region 68 and the channel diffusion region 67 depends on withstanding voltage between the collector region 63 and the base contact region 64 and a maximum current value Imax of the collector current Ic. FIGS. 16A, 16B show experimental result with respect to relationships between the overlap lengths L and the withstanding voltages or the maximum current values Imax.

Referring to FIGS. 16A, 16B, requested overlap length L having a withstanding voltage is 60V or more and maximum current value Imax is 3 mA or more, is 0 to 2 $\mu$m. Accordingly, in this embodiment, the overlap length L is set at between 0 to 2 $\mu$m. Incidentally, this value of the overlap length L is appropriate if a depth of the AD Nwell region 68 is set at 3 $\mu$m and a depth of the channel diffusion region 67 is set at 2 $\mu$m.

The opposing lengths of the collector region 63 and the emitter region 65 can be further lengthened when compared to the same area transistors if the size of the unit cells 61 is decreased using microscopic wiring technology, thereby increasing the capability for current flow.

The base contact region 64 is loop-shaped and encircles the collector region 63 in order to enlarge its area. Moreover, the base wiring layers 71*b* are formed depending on the base contact region 64. Accordingly, it is possible to increase a surge resistance.

Also, the emitter region 65 is loop-shaped to encircle the collector region 63 in order to enlarge its area. Accordingly, it is possible to further increase surge resistance. Further, parasitic diodes or transistors in the NPN transistors equally activate against surge current that may be generated when a voltage is applied to the collector region 63. Especially, respective emitter regions 65 provided for adjacent unit cells are interconnected, and the emitter wiring layers 71*c* are interconnected. Therefore, it is possible to further increase surge resistance and to enlarge an area at which the parasitic diodes or transistors in the NPN transistors can equally handle surge current.

In this embodiment, the burying diffusion region is not formed in the element forming layer 66*b*. Therefore, a thinner layer is adopted as the element forming layer 66*b*. Accordingly, an n− type region under the channel diffusion region 67 of the element forming layer 66*b* can be easily satisfied with a depletion layer. Therefore, a concentration of the n− type region can be set higher, thereby increasing current flow capability.

However, it is preferable that a thickness of the element forming layer 66*b* is at least 6 $\mu$m or more because the maximum current value Imax depends on the thickness and decreases if the thickness is too thin. Incidentally, this thickness of the element forming layer 66*b* is appropriately valued if a depth of the channel diffusion region 67 is set at 2 $\mu$m and a depth of the emitter region 65 is set at 1 $\mu$m. It is possible to modify the thickness depending on the depth of the channel diffusion layer 67 and the emitter region 65.

(Ninth Embodiment)

Figure 17A:
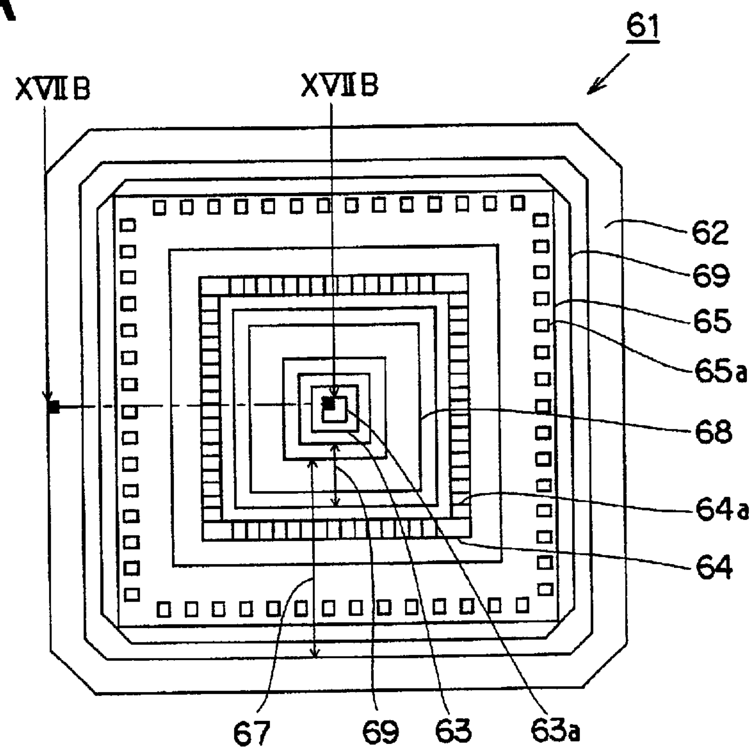
FIG. 17A is a front view showing NPN transistors according to a ninth embodiment of the present invention.
Figure 17B:
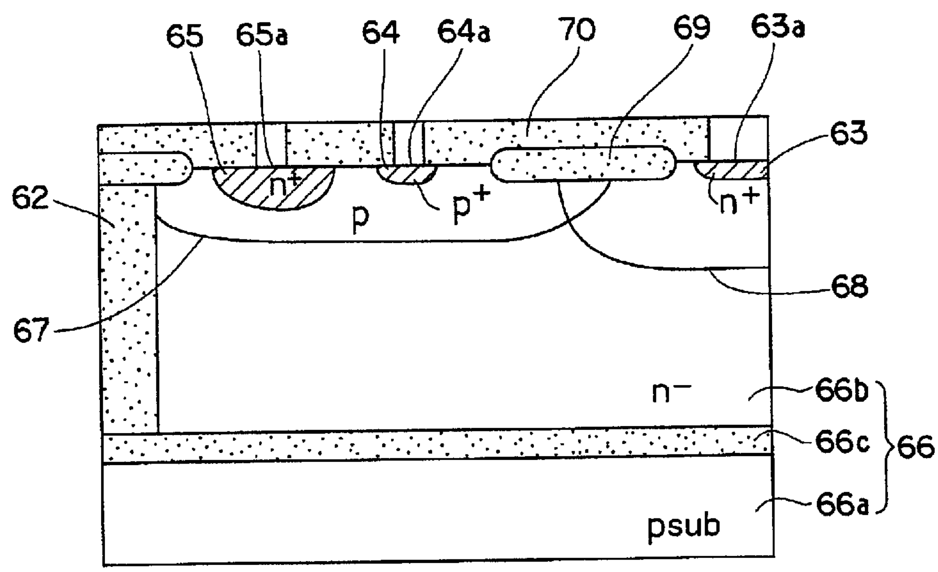
FIG. 17B is a cross sectional view taken along line XVIIB—XVIIB in FIG. 17A.

In the embodiment shown in FIGS. 17A–17B, respective unit cells 61 are encircled by trenches 62. The trenches 62 encircle a periphery of a channel diffusion region 67. That is, an emitter region 65 and the channel diffusion region 67 are not shared between adjacent unit cells 61.

In this embodiment, it is possible to encircle respective unit cells 61 by the trenches 62, thereby obtaining the same advantages of the eighth embodiment. Incidentally, first and second wiring layers (not shown) can be formed as in the eighth embodiment.

(Tenth Embodiment)

Figure 18A:
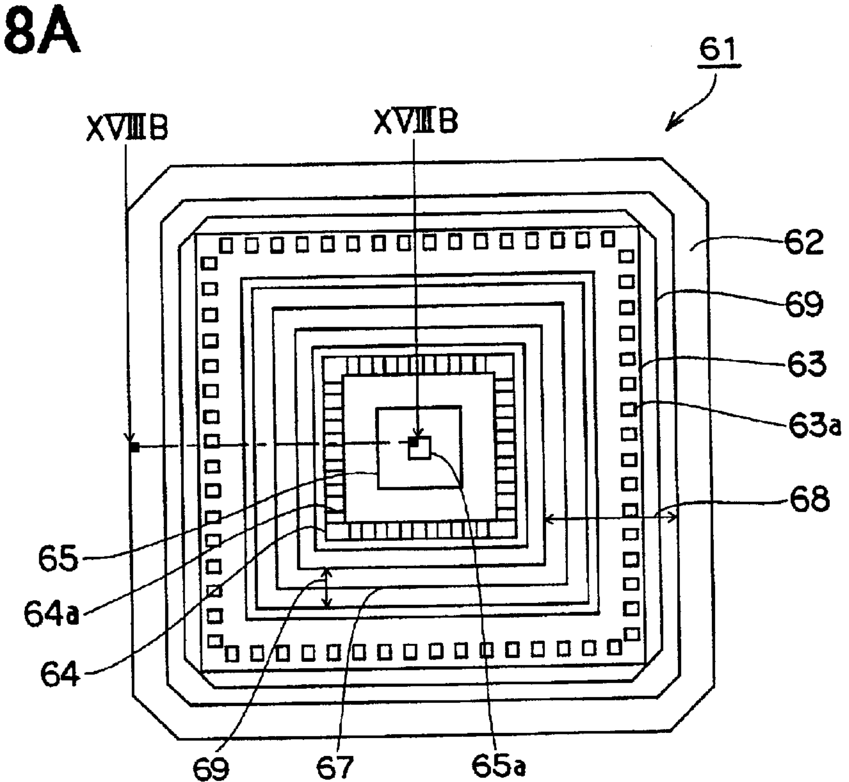
FIG. 18A is a front view showing NPN transistors according to a tenth embodiment of the present invention.
Figure 18B:
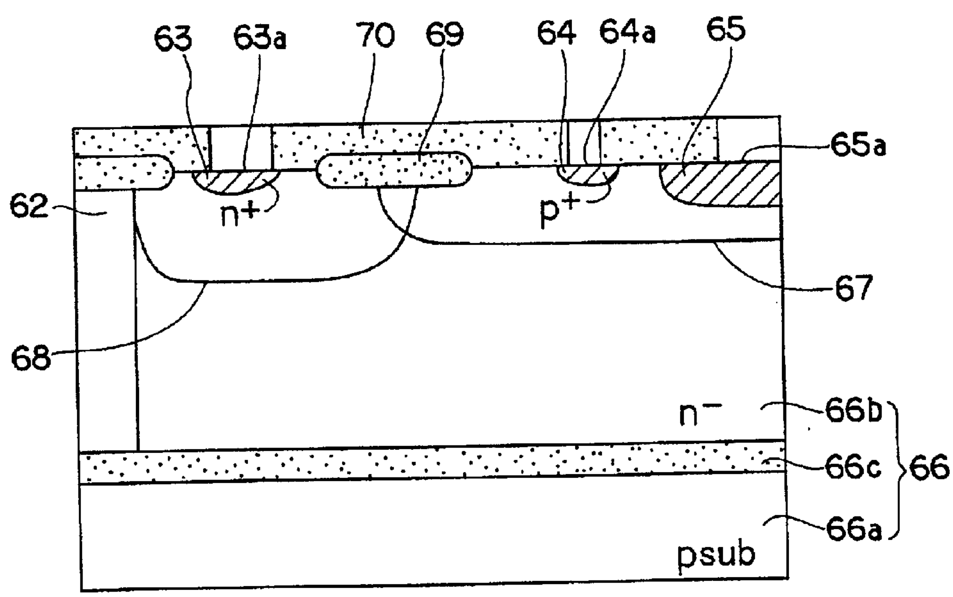
FIG. 18B is a cross sectional view taken along line XVIIIB—XVIIIB in FIG. 18A.

In the embodiment shown in FIGS. 18A–18B, an emitter region 65 is arranged in the center of respective unit cells 61. Trenches 62 encircle periphery of the unit cells 61. A channel diffusion region 67 is formed in the center of the unit cells 61. The emitter region 65 is formed on the center side of a surface region of the channel diffusion region 67. Also, a base contact region 64 is formed on the periphery side of the surface region of the channel diffusion region 67. Further, in the periphery side of the unit cells 61, a collector region 63 encircles the emitter region 65 and the channel diffusion region 67.

In this embodiment, it is possible to obtain the same advantages of the eighth embodiment. Incidentally, to prevent the NPN transistors from decreasing performance by a difference of the current amplification ratios HFE, it is preferable that a width of the emitter region 65 from the center of the unit cells 61 to the periphery thereof is set at 2 $\mu$m or more.

(Eleventh Embodiment)

In NPN transistors having emitter regions 65 formed in the center of respective unit cells 61, it is possible that trenches 2 encircle several unit cells 61.

Figure 19:
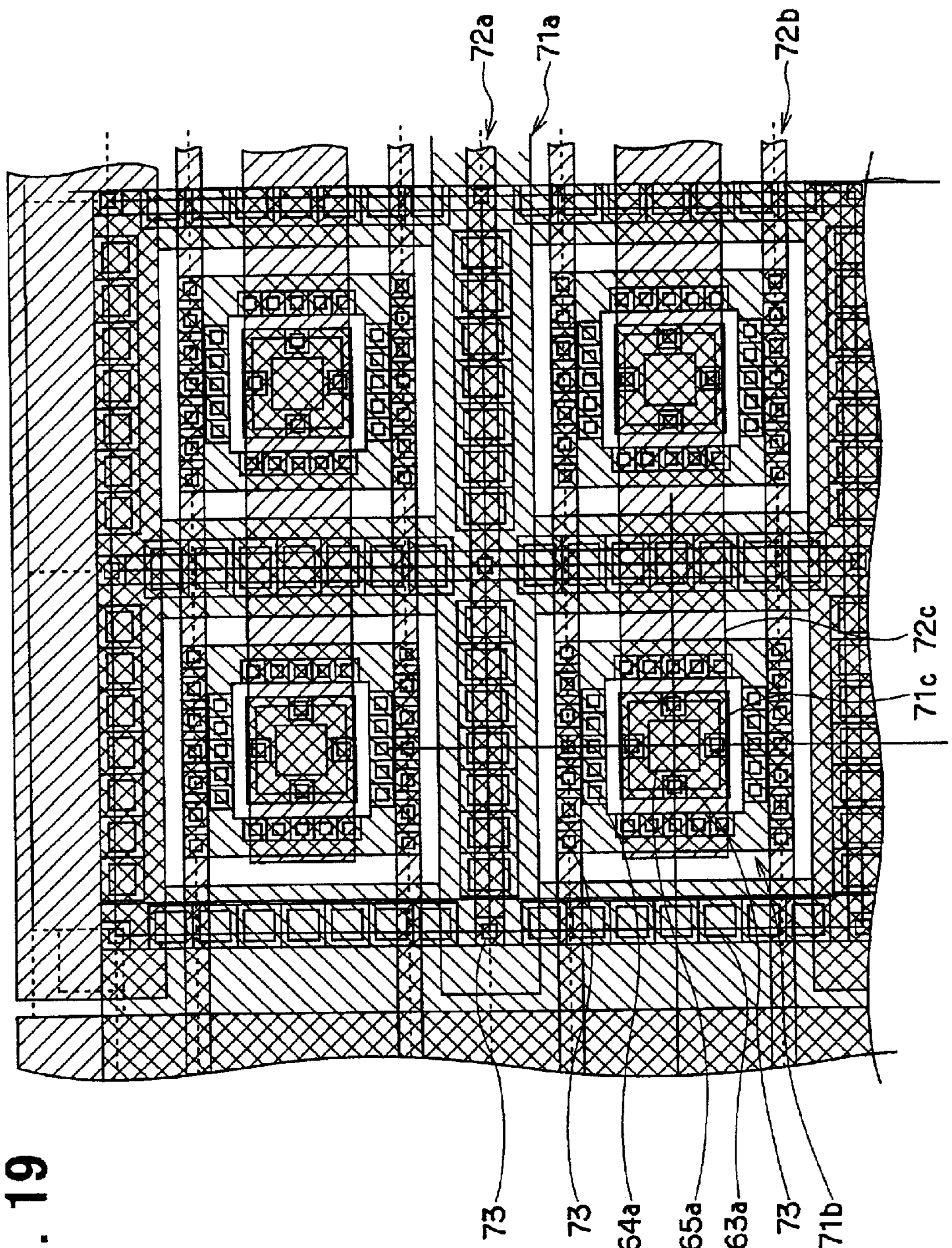
FIG. 19 is a layout view showing NPN transistors according to an eleventh embodiment of the present invention.

As shown in FIG. 19, in which wiring layers 71*a*–71*c* and 72*a*–72*c* are shown using hatching, respective collector regions 63, collector contact regions 63*a* and AD Nwell regions 68 may be shared by adjacent unit cells 61.

As shown in FIG. 19, emitter wiring layers 71*c* are rectangularly formed on respective emitter regions 65 and are electrically connected to stripe-shaped emitter wiring layers 72*c* through contact holes 73 formed in a passivating layer. Base wiring layers 71*b* are formed in a loop-shaped manner and are electrically connected to stripe-shaped base wiring layers 72*b* through the contact holes 73. The base wiring layers 72*b* laterally extend to in FIG. 19 on a side of the base wiring layers 71*b* and in a longitudinal direction therein at an outside of the unit cells 61. Collector wring layers 71*a* are formed in a loop-shaped manner and electrically connect to stripe-shaped collector wiring layers 72*a* through the contact holes 73. Adjacent collector wiring layers 71*a* are connected to each other to form a mesh-shape-configuration.

In this embodiment, it is possible to obtain the same advantages of the eighth embodiment.

(Twelfth Embodiment)

Figure 20:
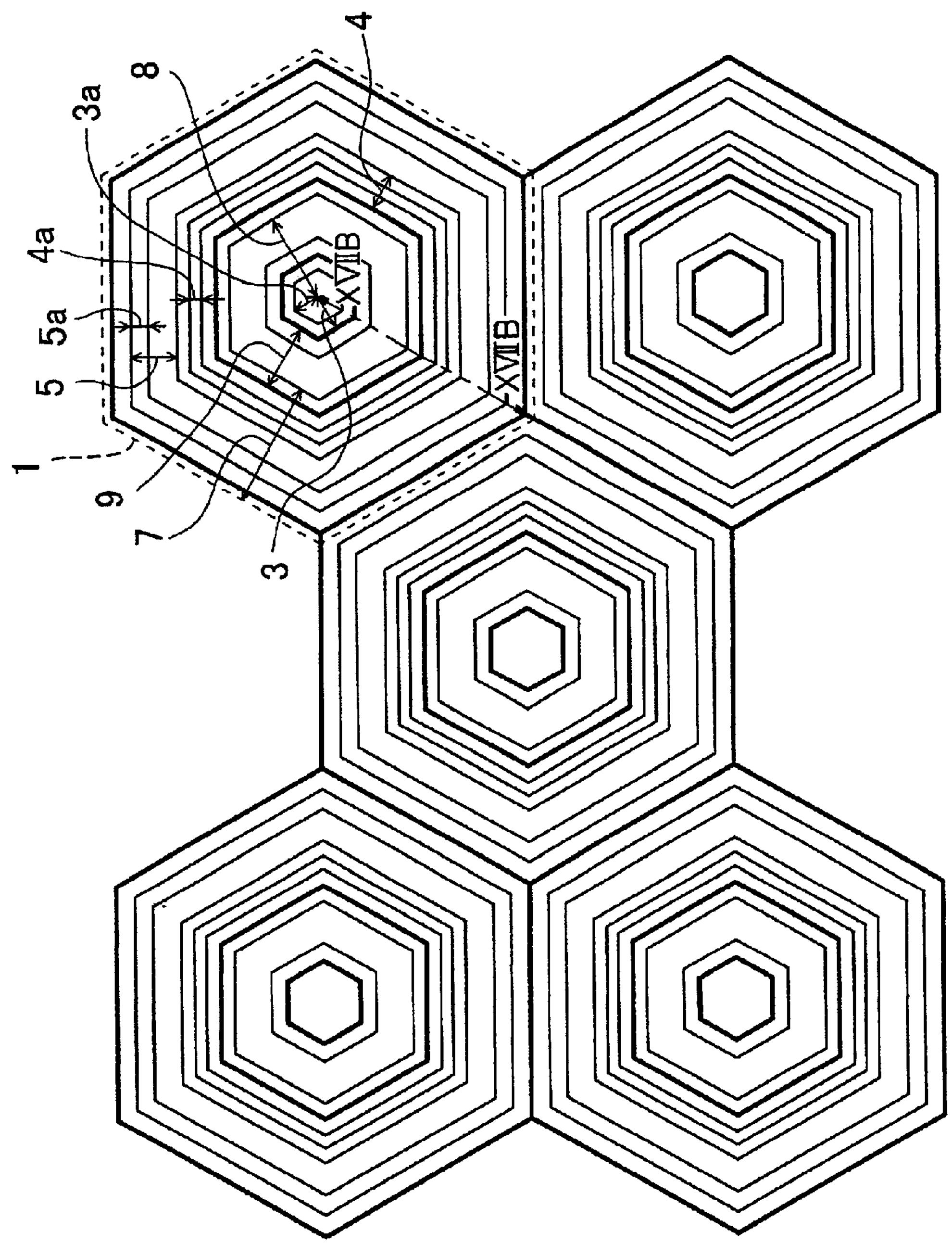
FIG. 20 is a front view showing NPN transistors according to a twelfth embodiment of the present invention.

In the embodiment shown in FIG. 20, a layout of NPN transistors is modified from that of the first to eleventh embodiments. Respective hexagonal unit cells 61 have respective centrally-arranged collector regions 63. Respective base contact regions 64 and emitter regions 65 encircle the collector regions 63 in this order. Incidentally, several unit cells 61 are encircled by trenches (not shown). A cross sectional view taken along line XVIIB—XVIIB in FIG. 20 is equal to FIG. 17B except with respect to the trench 2.

In this embodiment, the length between the collector region 63 and the emitter region 65 can be efficiently increased when several unit cells 61 are arranged to connect with each other. Also, it is possible to obtain the same advantages of the eighth embodiment. Further, it is possible for NPN transistors whose emitter regions are arranged in the center of respective unit cells to adopt the hexagon layout shown in FIG. 20.

(Thirteenth Embodiment)

Figure 21A:
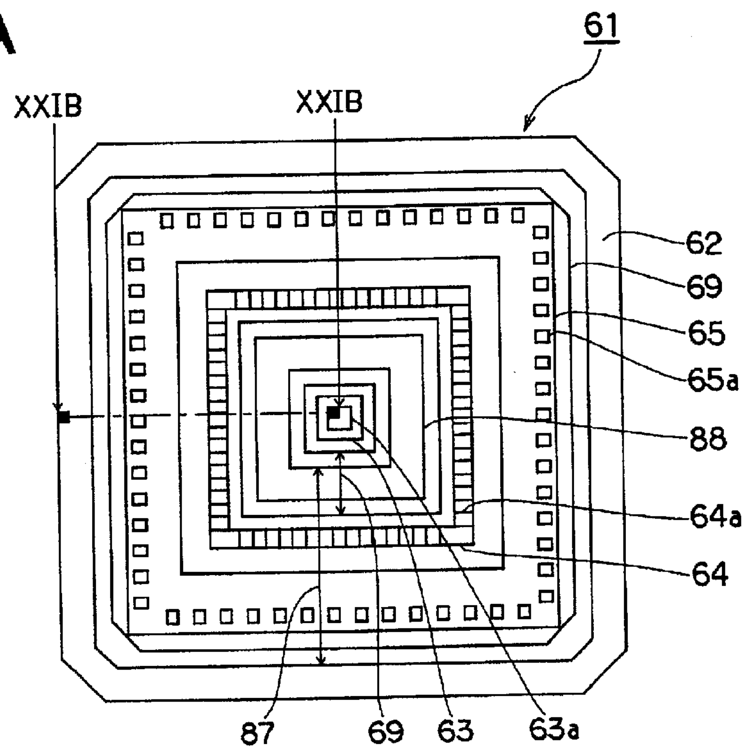
FIG. 21A is a front view showing PNP transistors according to a thirteenth embodiment of the present invention.
Figure 21B:
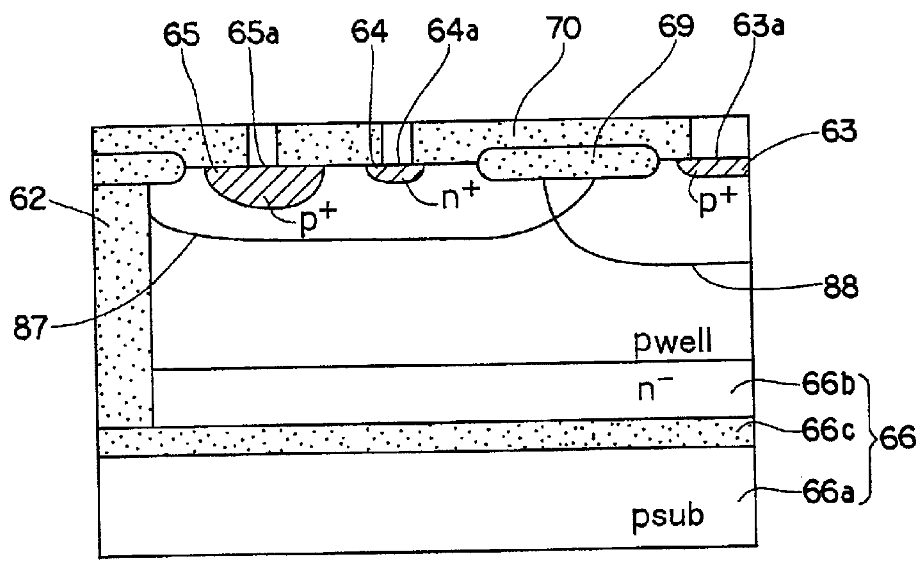
FIG. 21B is a cross sectional view taken along line XXB—XXB in FIG. 21A.

Referring to FIGS. 21A, 21B, in this embodiment, PNP transistors are described. Collector regions 63 are arranged in the center of unit cells 61. Respective base contact regions 64 and emitter regions 65 encircle the collector regions 63 in this order.

In the PNP transistors, first diffusion regions 87 and second diffusion regions 88 are formed in the surface region of an element forming layer 61*e*. The first and second diffusion regions 87, 88 correspond to the channel diffusion regions 67 and the AD Nwell region 68 of the NPN transistors in the eighth to twelfth embodiment. An impurity concentration of the first diffusion region 87 is $5\times10^{16}$ cm$^{-3}$ to $1\times10^{17}$ cm$^{-3}$. An impurity concentration of the second diffusion region 88 is about the same as the channel diffusion regions 67. Also, conductive types of respective elements such as the base contact region 64, the collector region 63 or the like are opposite those of the NPN transistors of the eighth to twelfth embodiments.

In this embodiment, it is possible to obtain the same advantages of the eighth embodiment.

(Thirteenth Embodiment)

Figure 22A:
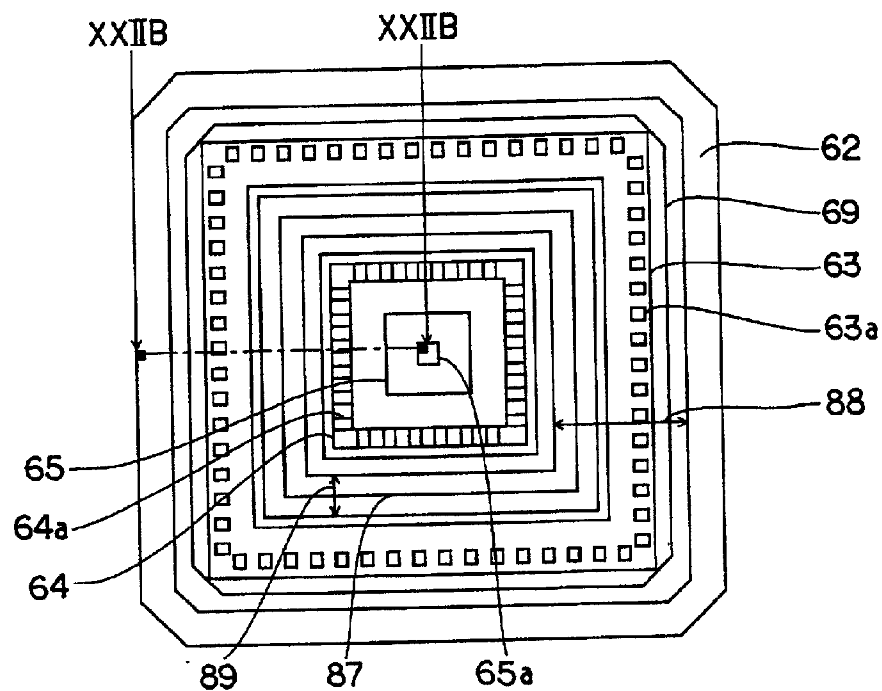
FIG. 22A is a front view showing PNP transistors according to a fourteenth embodiment of the present invention.
Figure 22B:
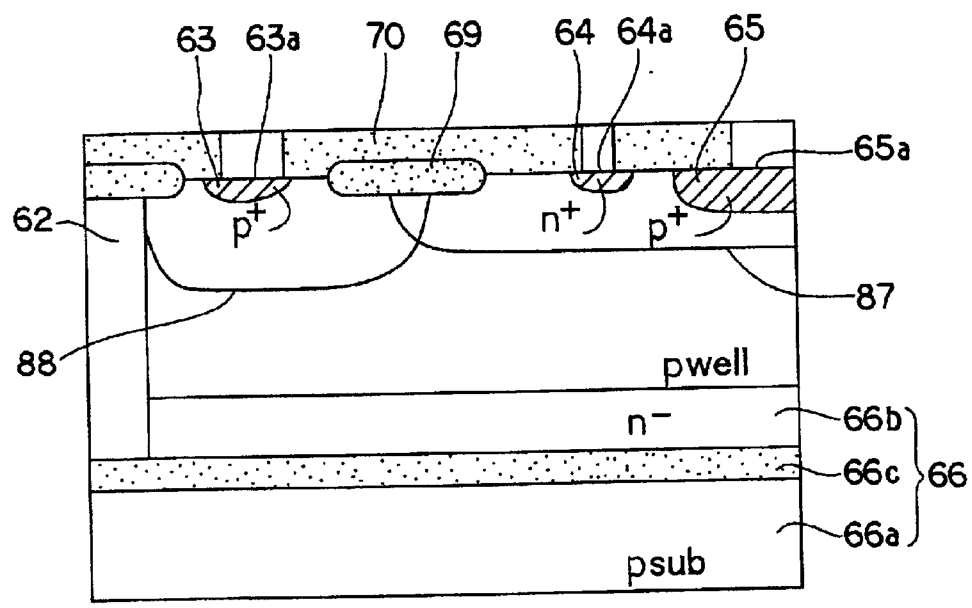
FIG. 22B is a cross sectional view taken along line XXIB—XXIB in FIG. 22A.
Figure 23A:
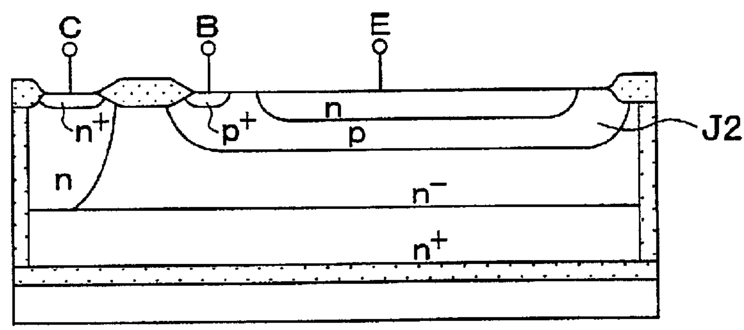
FIGS. 23A, 23B are front views showing NPN transistors and PNP transistors according a prior semiconductor device.
Figure 23B:
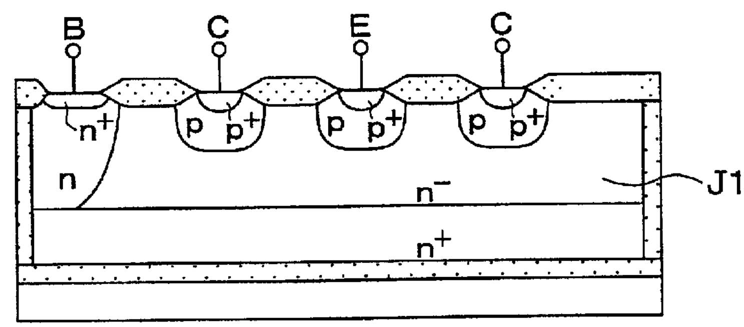
Figure 24:
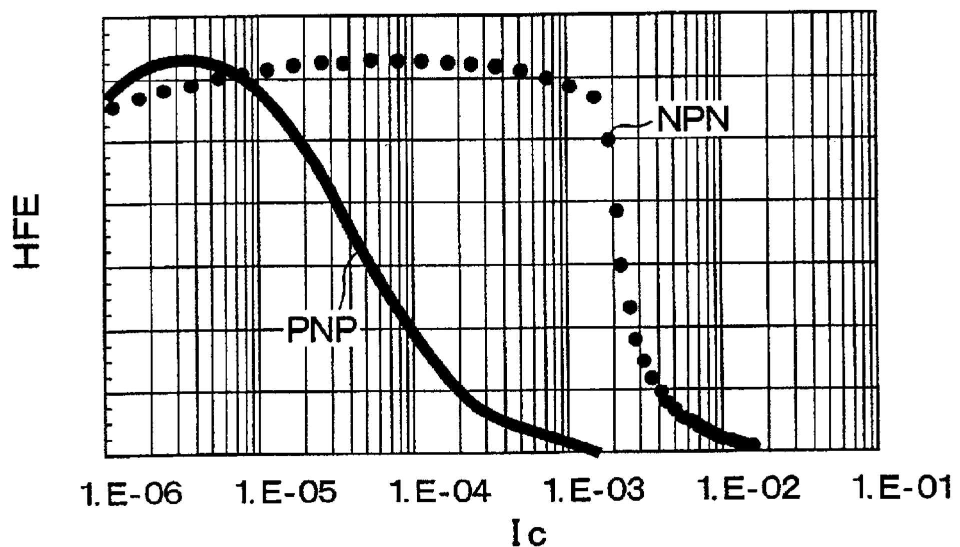
FIG. 24 is a data plot graph showing a relationship between collector currents Ic and current amplification ratios HFE of the prior semiconductor device.
Figure 25A:
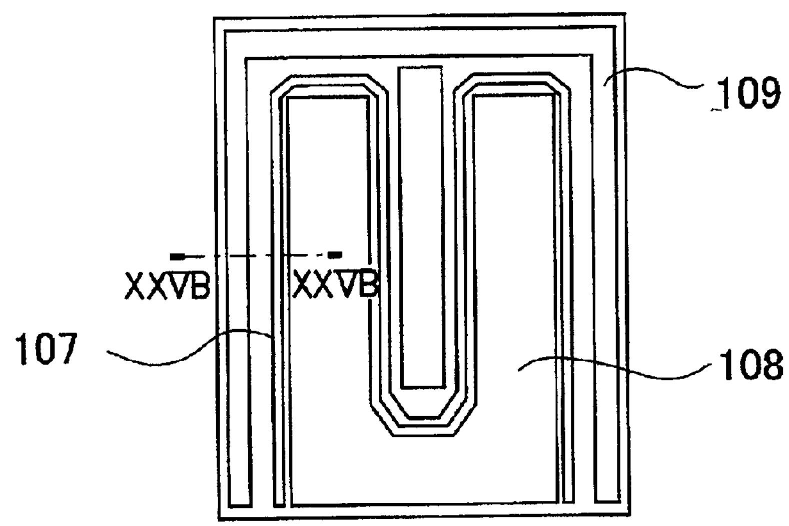
FIG. 25A is a front view showing PNP transistors according an other prior semiconductor device.
Figure 25B:
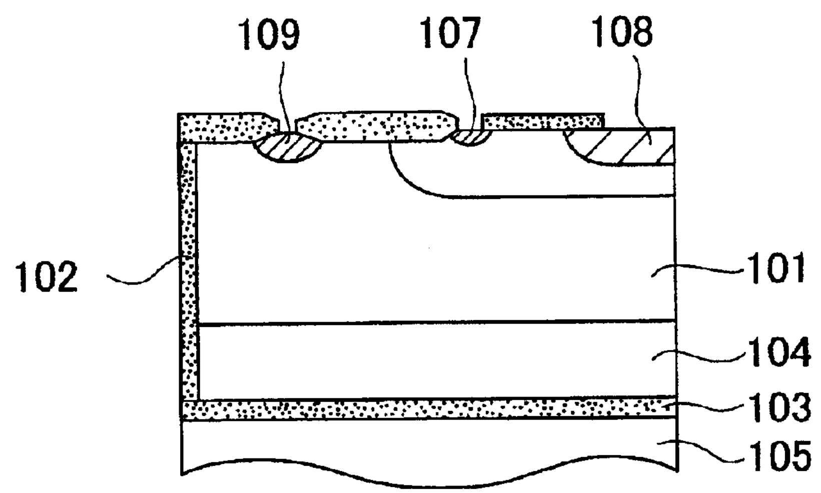
FIG. 25B is a cross sectional view taken along line XXVB—XXVB in FIG. 25A.

Referring to FIGS. 22A, 22B, in this embodiment, PNP transistors are described. Emitter regions 65 are arranged in the center of unit cells 61. Respective element such as base contact regions 64, collector regions 63 or the like are arranged opposite position of the twelfth embodiment.

In this embodiment, it is possible to obtain the same advantages of the eighth embodiments.

(Modifications)

In the first, fifth and sixth embodiments, the suction region 14 may be removed. In this case, in the PNP transistors shown in FIG. 2, the base region 13 and the emitter region 16 are arranged to encircle the collector region 9. Also, in the PNP transistors shown in FIG. 9, the base region 13 and the collector region 9 are arranged to encircle with the emitter region 16. Further, in the PNP transistors shown in FIG. 10, respective elements are symmetrically arranged around the respective emitter regions 16 of two PNP transistors as symmetry center.

Further, in the twelfth or the thirteenth embodiment, it is possible for the PNP transistors to adopt hexagon layout. In this case, several PNP transistors can be encircled by trenches.

While the above description is of the preferred embodiment of the present invention, it should be appreciated that the invention may be modified, altered, or varied without deviating from the scope and fair meaning of the following claims.

What is claimed is:

1. A semiconductor device comprising:

a semiconductor substrate;

an NPN bipolar transistor formed on the substrate in an NPN forming region and having an n type emitter region, a p type base region surrounding the n type emitter region and an n type collector region surrounding the n type base region; and a PNP bipolar transistor formed on the substrate in a PNP forming region and having a p type emitter region, an n type base region surrounding the p type emitter region and a p type collector region surrounding the n type base region;

wherein the NPN forming region and the PNP forming region both have a respective burying region of a like conductivity type or have no buryning region; and a current that flows from the p type emitter region to the n type base region in the PNP transistor flows in the n type base region in a direction perpendicular to the substrate.

2. A semiconductor device according to claim 1, further comprising:

a p type well region formed in the PNP forming region;

wherein the n type base region is formed on a surface region of the p type well region and the p type emitter region is formed on a surface region of the n type base region; and wherein a distance from a bottom portion of the p type emitter region to the p type well region in the direction perpendicular to the substrate is a shortest distance from the p type emitter region to the p type well region.

3. A semiconductor device according to claim 2, wherein the p type collector region is arranged in a center of the PNP bipolar transistor, and the n type base region and the p type emitter region are formed around the p type collector region.

4. A semiconductor device according to claim 2, wherein the p type emitter region is arranged in a center of the PNP bipolar transistor, and the n type base region and the p type collector region arc formed around the p type emitter region.

5. A semiconductor device according to claim 2, wherein the p type collector, the n type base region and the p type emitter region are arranged in stripe-like manner.

6. A semiconductor device according to claim 2, further compnsingig:

an n type suction region formed in the p type well region to suck carriers injected from the p type emitter region.

7. A semiconductor device according to claim 1, further comprising:

a p type diffusion region formed in the PNP forming region for encompassing the p type collector region.

8. A semiconductor device according to claim 7, wherein the n type base region overlaps a first diffusion region by an overlap length defined as a distance from an end of the p type diffusion region to an end of the n type base region on a surface of the substrate of approximately 0 to 2 μm.

9. A semiconductor device according to claim 8, wherein the PNP transistor comprises a unit cell, and a width of the emitter region in a direction from the center of the unit cell to a peripheral side thereof is at least 2 μm.

10. A semiconductor device according to claim 1, wherein an impurity concentration of then type base region is approximately $5\times10^{16}$ $cm^{-3}$ to $1\times10^{17}$ $cm^{-3}$.

11. A semiconductor device according to claim 1, wherein the n type collector region is arranged in a center of the NPN bipolar transistor, and the p type base region and the n type emitter region are formed around the n type collector region.

12. A semiconductor device according to claim 1, wherein the n type emitter region is arranged in a center of the NPN bipolar transistor, the p type base region and the n type collector region are formed around the n type emitter region.

13. A semiconductor device according to claim 1, further comprising:

an n type diffusion region formed in the NPN forming region for encompassing the n type collector region;

wherein an impurity of then type diffusion region is approximately $5\times10^{16}$ $cm^{-3}$ to $1\times10^{17}$ $cm^{-3}$.

14. A semiconductor device according to claim 13, wherein the p type base region overlaps the n type diffusion region by an overlap length defined as a distance from an end of the n type diffusion region to an end of the n type base region on a surface of the substrate of approximately 0 to 2 μm.

15. A semiconductor device according to claim 14, wherein the NPN transistor comprises a unit cell, and a width of the emitter region in a direction from the center of the unit cell to a peripheral side thereof is at least 2 μm.

16. A semiconductor device according to claim 1, wherein at least one of the NPN transistor and the PNP transistor comprises a hexagonal unit cell.

17. A semiconductor device according to claim 1, wherein the substrate is comprises an 501 substrate having a support layer, an element forming layer and a burying oxide layer that is disposed between the support layer and the element forming layer, wherein the element forming layer is less than 6 μm.

18. A semiconductor device according to claim 1, further comprising a CMOS having a NMOS transistor and a PMOS transistor both formed on the surface of the substrate.

19. A semiconductor device according to claim 1, further comprising a LDMOS formed on the surface of the substrate.

20. A semiconductor device comprising:

a semiconductor substrate that is comprised an SOI substrate having a support layer, an element forming layer and a burying oxide layer that is disposed between the support layer and the element forming layer;

an NPN bipolar transistor formed on the element forming layer of the substrate in an NPN forming region and having an n type emitter region, p type base region surrounding the n type emitter region and an n type collector region surrounding the p type base region;

a PNP bipolar transistor formed on the element forming layer of the substrate in a PNP forming region and having p type emitter region, an n type base region surrounding the p type emitter region and a p type collector region surrounding the n type base region;

at least one trench formed in the element forming layer for isolating between the NPN bipolar transistor and the PNP bipolar transistor; and wherein the NPN forming region and the PNP forming region both have a respective burying region of a like conductivity type or have no burying region;

wherein a current that flows from the p type emitter region to the n type base region in the PNP transistor flows in the n type base region in a direction perpendicular to the substrate.

21. A semiconductor device according to claim 20, further comprising:

a p type well region formed in the PNP forming region;

wherein the n type base region is formed on a surface region of the p type well region and the p type emitter region is formed on a surface region of the n type base region; and wherein a distance from a bottom portion of the p type emitter region to the p type well region in the direction perpendicular to the substrate is a shortest distance from the p type emitter region to the p type well region.

22. A semiconductor device according to claim 21, wherein the p type collector region is arranged in a center of the PNP bipolar transistor, and the n type base region and the p type emitter region are formed around the p type collector region.

23. A semiconductor device according to claim 21, wherein the p type emitter region is arranged in a center of the PNP bipolar transistor, and the n type base region and the p type collector region are formed around the p type emitter region.

24. A semiconductor device according to claim 21, wherein the p type collector, the n type base region and the p type emitter region are arranged in stripe-like manner.

25. A semiconductor device according to claim 21, further comprising:

an n type suction region formed in the p type well region to suck carriers injected from the p type emitter region.

26. A semiconductor device according to claim 20, further comprising:

a p type diffusion region formed in the PNP forming region for encompassing the p type collector region.

27. A semiconductor device according to claim 26, wherein the n type base region overlaps a first diffusion region by an overlap length defined as a distance from an end of the p type diffusion region to an end of the n type base region on a surface of the substrate of approximately 0 to 2 $\mu$m.

28. A semiconductor device according to claim 27, wherein the PNP transistor comprises a unit cell, and a width of the emitter region in a direction from the center of the unit cell to a peripheral side thereof is at least 2 $\mu$m.

29. A semiconductor device according to claim 20, wherein an impurity concentration of then type base region is approximately $5\times10^{16}$ cm$^{-3}$ to $1\times10^{17}$ cm$^{-3}$.

30. A semiconductor device according to claim 20, wherein the n type collector region is arranged in a center of the NPN bipolar transistor, and the p type base region and the n type emitter region are formed around the n type collector region.

31. A semiconductor device according to claim 20, wherein the n type emitter region is arranged in a center of the NPN bipolar transistor, the p type base region and the n type collector region are formed around the n type emitter region.

32. A semiconductor device according to claim 20, further comprising:

an n type diffusion region formed in the NPN forming region for encompassing the n type collector region;

wherein an impurity of then type diffusion region is approximately $5\times10^{16}$ cm$^{31\ 3}$ to $1\times10^{17}$ cm$^{-3}$.

33. A semiconductor device according to claim 32, wherein the p type base region overlaps the n type diffusion region by an overlap length defined as a distance from an end of then type diffusion region to an end of the n type base region on a surface of the substrate of approximately 0 to 2 $\mu$m.

34. A semiconductor device according to claim 33, wherein the NPN transistor comprises a unit cell, and a width of the emitter region in a direction from the center of the unit cell to a peripheral side thereof is at least 2 $\mu$m.

35. A semiconductor device according to claim 20, wherein at least one of the NPN transistor and the PNP transistor comprises a hexagonal unit cell.

36. A semiconductor device according to claim 20, wherein the element forming layer is less than 6 $\mu$m.

37. A semiconductor device according to claim 20, further comprising a CMOS having a NMOS transistor and a PMOS transistor both formed on the surface of the substrate.

38. A semiconductor device according to claim 20, further comprising a LDMOS formed on the surface of the substrate.

39. A semiconductor device comprising:

a semiconductor substrate;

an NPN bipolar transistor formed on the substrate in an NPN forming region and having an n type emitter region, an n type collector region and a p type base region;

a PNP bipolar transistor formed on the substrate in a PNP forming region and having a p type emitter region, a p type collector region and an n type base region;

only one conductive type burying region formed in at least one of the NPN forming region and the PNP forming region; and a p type well region formed in the PNP forming region, wherein the n type base region is formed on a surface region of the p type well region and the p type emitter region is formed on a surface region of the n type base region, a distance from a bottom portion of the p type emitter region to the p type well region in the direction perpendicular to the substrate is a shortest distance from the p type emitter region to the p type well region, a current that flows from the p type emitter region to the n type base region in the PNP transistor flows in the n type base region in a direction perpendicular to the substrate, and the p type collector region is arranged in a center of the PNP bipolar transistor, and the n type base region and the p type emitter region are formed around the p type collector region.

40. A semiconductor device comprising:

a semiconductor substrate;

an NPN bipolar transistor formed on the substrate in an NPN forming region and having an n type emitter region, an n type collector region and a p type base region;

a PNP bipolar transistor fanned on the substrate in a PNP forming region and having a p type emitter region, a p type collector region and an n type base region;

only one conductive type burying region formed in at least one of the NPN forming region and the PNP forming region;

a p type well region formed in the PNP forming region; and an n type suction region formed in the p type well region to suck carriers injected from the p type emitter region, wherein the n type base region is formed on a surface region of the p type well region and the p type emitter region is formed on a surface region of the n type base region, a distance from a bottom portion of the p type emitter region to the p type well region in the direction perpendicular to the substrate is a shortest distance from the p type emitter region to the p type well region, and a current that flows from the p type emitter region to the n type base region in the PNP transistor flows in the n type base region in a direction perpendicular to the substrate.

41. A semiconductor device comprising:

a semiconductor substrate;

an NPN bipolar transistor formed on the substrate in an NPN forming region and having an n type emitter region, an n type collector region and a p type base region;

a PNP bipolar transistor formed on the substrate in a PNP forming region and having a p type emitter region, a p type collector region and an n type base region;

only one conductive type burying region formed in at least one of the NPN forming region and the PNP forming region; and a p type diffusion region formed in the PNP forming region for encompassing the p type collector region, wherein the n type base region overlaps a first diffusion region by an overlap length defined as a distance from an end of the p type diffusion region to an end of the n type base region on a surface of the substrate of approximately 0 to 2 $\mu$m, and a current that flows from the p type emitter region to the n type base region in the PNP transistor flows in the n type base region in a direction perpendicular to the substrate.

42. A semiconductor device according to claim 41, wherein the PNP transistor comprises a unit cell, and a width of the emitter region in a direction from the center of the unit cell to a peripheral side thereof is at least 2 $\mu$m.

43. A semiconductor device comprising:

a semiconductor substrate;

an NPN bipolar transistor formed on the substrate in an NPN forming region and having an n type emitter region, an n type collector region and a p type base region;

a PNP bipolar transistor formed on the substrate in a PNP forming region and having a p type emitter region, a p type collector region and an n type base region; and only one conductive type burying region formed in at least one of the NPN forming region and the PNP forming region, wherein the n type collector region is arranged in a center of the NPN bipolar transistor, and the p type base region and the n type emitter region are formed around the n type collector region, and a current that flows from the p type emitter region to the n type base region in the PNP transistor flows in the n type base region in a direction perpendicular to the substrate.

44. A semiconductor device comprising:

a semiconductor substrate;

an NPN bipolar transistor formed on the substrate in an NPN forming region and having an n type emitter region, an n type collector region and a p type base region;

a PNP bipolar transistor formed on the substrate in a PNP forming region and having a p type emitter region, a p type collector region and an n type base region;

only one conductive type burying region formed in at least one of the NPN forming region and the PNP forming region; and an n type diffusion region formed in the NPN forming region for encompassing then type collector region and having an impurity of approximately $5\times10^{16}$ $cm^{-3}$ to $1\times10^{17}$ $cm^{-3}$, wherein the p type base region overlaps the n type diffusion region by an overlap length defined as a distance from an end of the n type diffusion region to an end of the n type base region on a surface of the substrate of approximately 0 to 2 $\mu$m, and a current that flows from the p type emitter region to the n type base region in the PNP transistor flows in the n type base region in a direction perpendicular to the substrate.

45. A semiconductor device according to claim 44, wherein the NPN transistor comprises a unit cell, and a width of the emitter region in a direction from the center of the unit cell to a peripheral side thereof is at least 2$\mu$m.

46. A semiconductor device comprising:

a semiconductor substrate;

an NPN bipolar transistor formed on the substrate in an NPN forming region and having an n type emitter region, an n type collector region and a p type base region;

a PNP bipolar transistor formed on the substrate in a PNP forming region and having a p type emitter region, a p type collector region and an n type base region; and only one conductive type burying region formed in at least one of the NPN forming region and the PNP forming region, wherein at least one of the NPN transistor and the PNP transistor comprises a hexagonal unit cell; and wherein a current that flows from the p type emitter region to the n type base region in the PNP transistor flows in the n type base region in a direction perpendicular to the substrate.

47. A semiconductor device comprising:

a semiconductor substrate;

an NPN bipolar transistor formed on the substrate in an NPN forming region and having an n type emitter region, an n type collector region and a p type base region;

a PNP bipolar transistor formed on the substrate in a PNP forming region and having a p type emitter region, a p type collector region and an n type base region; and only one conductive type burying region formed in at least one of the NPN forming region and the PNP forming region, wherein the substrate comprises an SOI substrate having a support layer, an element forming layer and a burying oxide layer that is disposed between the support layer and the element forming layer, wherein the element forming layer is less than 6 $\mu$m, and a current that flows from the p type emitter region to the n type base region in the PNP transistor flows in the n type base region in a direction perpendicular to the substrate.

48. A semiconductor device comprising:

a semiconductor substrate that is comprised an SOI substrate having a support layer, an element forming layer and a burying oxide layer that is disposed between the support layer and the element forming layer;

an NPN bipolar transistor formed on the element forming layer of the substrate in an NPN forming region and having a n type emitter region, a n type collector region and an p type base region;

a PNP bipolar transistor formed on the element forming layer of the substrate in a PNP forming region and having an p type emitter region, an p type collector region and a n type base region;

at least one trench formed in the element forming layer for isolating between the NPN bipolar transistor and the PNP bipolar transistor;

only one conductive type burying region formed in at least one of the NPN forming region and the PNP forming region; and a p type well region formed in the PNP forming region, wherein the n type base region is formed on a surface region of the p type well region and the p type emitter region is formed on a surface region of the n type base region, a distance from a bottom portion of the p type emitter region to the p type well region in the direction perpendicular to the substrate is a shortest distance from the p type emitter region to the p type well region, the p type collector region is arranged in a center of the PNP bipolar transistor, and the n type base region and the p type emitter region are formed around the p type collector region, and a current that flows from the p type emitter region to the n type base region in the PNP transistor flows in the n type base region in a direction perpendicular to the substrate.

49. A semiconductor device comprising:

a semiconductor substrate that is comprised an SOI substrate having a support layer, an element forming layer and a burying oxide layer that is disposed between the support layer and the element forming layer;

an NPN bipolar transistor formed on the element forming layer of the substrate in an NPN forming region and having a n type emitter region, a n type collector region and an p type base region;

a PNP bipolar transistor formed on the element forming layer of the substrate in a PNP forming region and having an p type emitter region, an p type collector region and a n type base region;

at least one trench formed in the element forming layer for isolating between the NPN bipolar transistor and the PNP bipolar transistor;

only one conductive type burying region formed in at least one of the NPN forming region and the PNP forming region;

a p type well region formed in the PNP forming region; and an n type suction region formed in the p type well region to suck carriers injected from the n type emitter region, wherein the n type base region is formed on a surface region of the p type well region and the p type emitter region is formed on a surface region of the n type base region, a distance from a bottom portion of the p type emitter region to the p type well region in the direction perpendicular to the substrate is a shortest distance from the p type emitter region to the p type well region, and a current that flows from the p type emitter region to the n type base region in the PNP transistor flows in the n type base region in a direction perpendicular to the substrate.

50. A semiconductor device comprising:

a semiconductor substrate that is comprised an SOI substrate having a support layer, an element forming layer and a burying oxide layer that is disposed between the support layer and the element forming layer;

an NPN bipolar transistor formed on the element forming layer of the substrate in an NPN forming region and having a n type emitter region, a n type collector region and an p type base region;

a PNP bipolar transistor comprising a unit cell and formed on the element forming layer of the substrate in a PNP forming region, the PNP bipolar transistor having a p type emitter region having a width in a direction from the center of the unit cell to a peripheral side thereof of at least 2 μm, a p type collector region and a n type base region;

at least one trench formed in the element forming layer for isolating between the NPN bipolar transistor and the PNP bipolar transistor; and only one conductive type burying region formed in at least one of the NPN forming region and the PNP forming region; and a p type diffusion region formed in the PNP forming region for encompassing the p type collector region, wherein the n type base region overlaps a first diffusion region by an overlap length defined as a distance from an end of the p type diffusion region to an end of the n type base region on a surface of the substrate of approximately 0 to 2 μm, and a current that flows from the p type emitter region to the n type base region in the PNP transistor flows in the n type base region in a direction perpendicular to the substrate.

51. A semiconductor device comprising:

a semiconductor substrate that is comprised an SOI substrate having a support layer, an element forming layer and a burying oxide layer that is disposed between the support layer and the element forming layer;

an NPN bipolar transistor formed on the element forming layer of the substrate in an NPN forming region and having a n type emitter region, a n type collector region and an p type base region;

a PNP bipolar transistor formed on the element forming layer of the substrate in a PNP forming region and having an p type emitter region, an p type collector region and a n type base region;

at least one trench formed in the element forming layer for isolating between the NPN bipolar transistor and the PNP bipolar transistor; and only one conductive type burying region formed in at least one of the NPN forming region and the PNP forming region, wherein the n type collector region is arranged in a center of the NPN bipolar transistor, and the p type base region and the n type emitter region are formed around the n type collector region, and a current that flows from the p type emitter region to the n type base region in the PNP transistor flows in the n type base region in a direction perpendicular to the substrate.

52. A semiconductor device comprising:

a semiconductor substrate that is comprised an SOI substrate having a support layer, an element forming layer and a burying oxide layer that is disposed between the support layer and the element forming layer;

an NPN bipolar transistor formed on the element forming layer of the substrate in an NPN forming region and having a n type emitter region, a n type collector region and an p type base region;

a PNP bipolar transistor formed on the element forming layer of the substrate in a PNP forming region and having an p type emitter region, an p type collector region and a n type base region;

at least one trench formed in the element forming layer for isolating between the NPN bipolar transistor and the PNP bipolar transistor;

only one conductive type burying region formed in at least one of the NPN forming region and the PNP forming region; and an n type diffusion region formed in the NPN forming region for encompassing the n type collector region and having an impurity of approximately $5\times10^{16}$ $cm^{-3}$ to $1\times10^{17}$ $cm^{-3}$, wherein the p type base region overlaps the n type diffusion region by an overlap length defined as a distance from an end of the n type diffusion region to an end of the n type base region on a surface of the substrate of approximately 0 to 2 $\mu$m, and a current that flows from the p type emitter region to the n type base region in the PNP transistor flows in the n type base region in a direction perpendicular to the substrate.

53. A semiconductor device according to claim 52, wherein the NPN transistor comprises a unit cell, and a width of the emitter region in a direction from the center of the unit cell to a peripheral side thereof is at least 2 $\mu$m.

54. A semiconductor device comprising:

a semiconductor substrate that is comprised an SOI substrate having a support layer, an element forming layer and a burying oxide layer that is disposed between the support layer and the element forming layer;

an NPN bipolar transistor formed on the element forming layer of the substrate in an NPN forming region and having a n type emitter region, a n type collector region and an p type base region;

a PNP bipolar transistor formed on the element forming layer of the substrate in a PNP forming region and having an p type emitter region, an p type collector region and a n type base region;

at least one trench formed in the element forming layer for isolating between the NPN bipolar transistor and the PNP bipolar transistor; and only one conductive type burying region formed in at least one of the NPN forming region and the PNP forming region, wherein at least one of the NPN transistor and the PNP transistor comprises a hexagonal unit cell, and a current that flows from the p type emitter region to the n type base region in the PNP transistor flows in the n type base region in a direction perpendicular to the substrate.

55. A semiconductor device comprising:

a semiconductor substrate that is comprised an SOI substrate having a support layer, an element forming layer and a burying oxide layer that is disposed between the support layer and the element forming layer;

an NPN bipolar transistor formed on the element forming layer of the substrate in an NPN forming region and having a n type emitter region, a n type collector region and an p type base region;

a PNP bipolar transistor formed on the element forming layer of the substrate in a PNP forming region and having an p type emitter region, an p type collector region and a n type base region;

at least one trench formed in the element forming layer for isolating between the NPN bipolar transistor and the PNP bipolar transistor; and only one conductive type burying region formed in at least one of the NPN forming region and the PNP forming region, wherein the element forming layer is less than 6 $\mu$m, and a current that flows from the p type emitter region to the n type base region in the PNP transistor flows in the n type base region in a direction perpendicular to the substrate.

* * * * *